United States Patent
Kawachi et al.

(10) Patent No.: US 6,891,588 B2
(45) Date of Patent: May 10, 2005

(54) LIQUID CRYSTAL DISPLAY DEVICE

(75) Inventors: Genshirou Kawachi, Chiba (JP); Toshio Miyazawa, Chiba (JP); Tetsuya Nagata, Mobara (JP); Atsushi Hasegawa, Togane (JP)

(73) Assignee: Hitachi, Ltd., Tokyo (JP)

( * ) Notice: Subject to any disclaimer, the term of this patent is extended or adjusted under 35 U.S.C. 154(b) by 28 days.

(21) Appl. No.: 10/122,214

(22) Filed: Apr. 16, 2002

(65) Prior Publication Data

US 2002/0149724 A1 Oct. 17, 2002

(30) Foreign Application Priority Data

Apr. 16, 2001 (JP) ........................................ 2001-116286

(51) Int. Cl.$^7$ .......................................... G02F 1/1335
(52) U.S. Cl. ...................................... 349/114; 349/113
(58) Field of Search ................................ 349/113, 114

(56) References Cited

U.S. PATENT DOCUMENTS 5,576,860 A * 11/1996 Nakamura et al. .......... 349/113
5,990,988 A * 11/1999 Hanihara et al. ............. 349/48
6,433,767 B1 * 8/2002 Murade ....................... 345/92

FOREIGN PATENT DOCUMENTS

KR          P-2002-0015228          8/2000

* cited by examiner

Primary Examiner—Robert H. Kim
Assistant Examiner—George Y. Wang
(74) Attorney, Agent, or Firm—Reed Smith L.L.P.; Stanley P. Fisher, Esq.; Juan Carlos A. Marquez, Esq.

(57) ABSTRACT

In a liquid crystal display device having a transmissive display region and a reflective display region within a unit pixel, the present invention disposes an optical reflection layer having an almost rectangular planar shape as extended in the unit pixel elongate direction at substantially a central portion midway between two neighboring signal electrodes, defines almost rectangular regions between the optical reflection layer and two signal electrodes adjacent thereto as the transmissive display region in the unit pixel, and forms a pixel electrode at a level spaced from that of the optical reflection layer by a dielectric film so as to cover the entire surface of the unit pixel, so that power consumption of the liquid crystal display device is reduced while image quality thereof is improved.

7 Claims, 19 Drawing Sheets

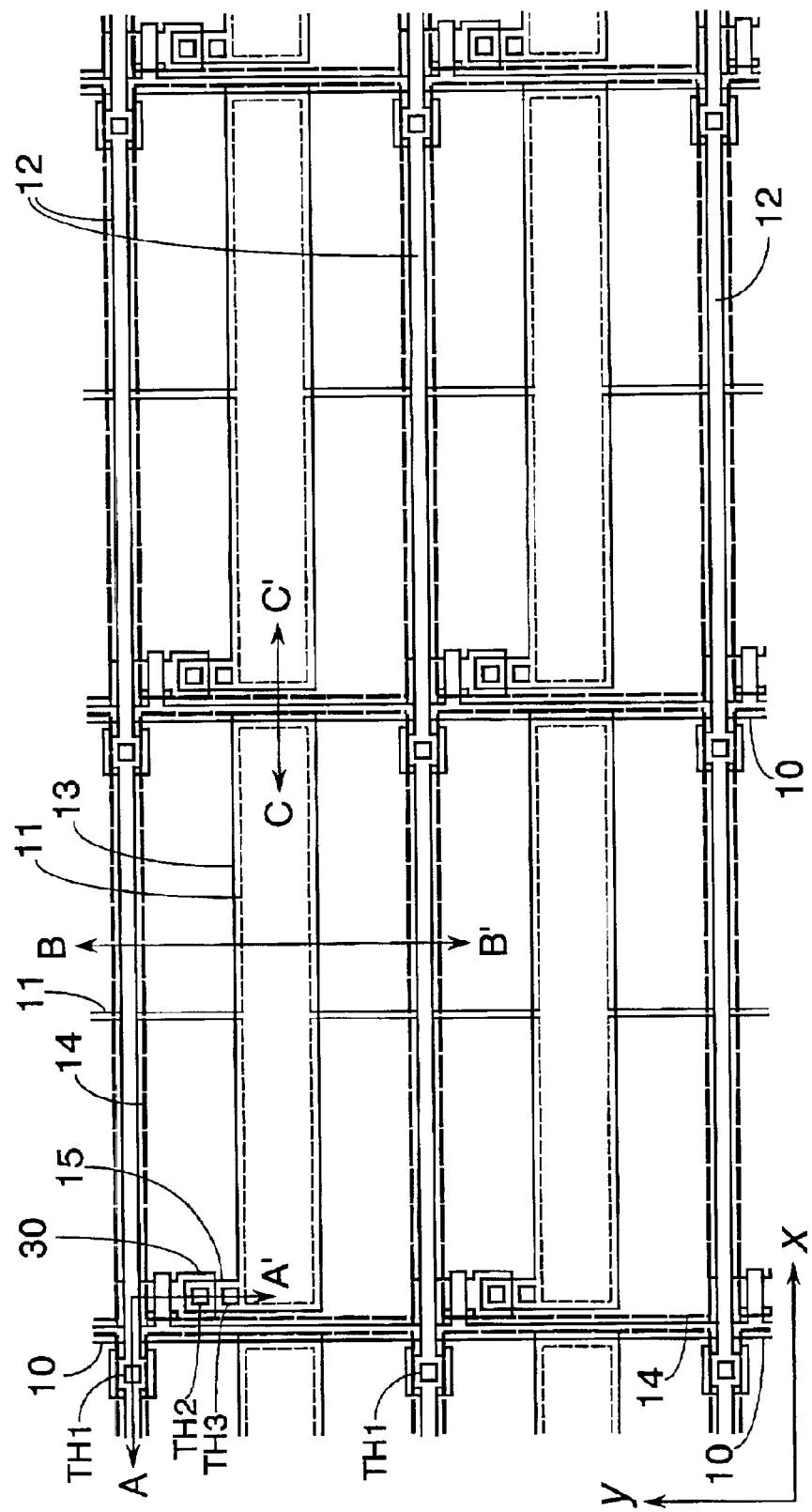

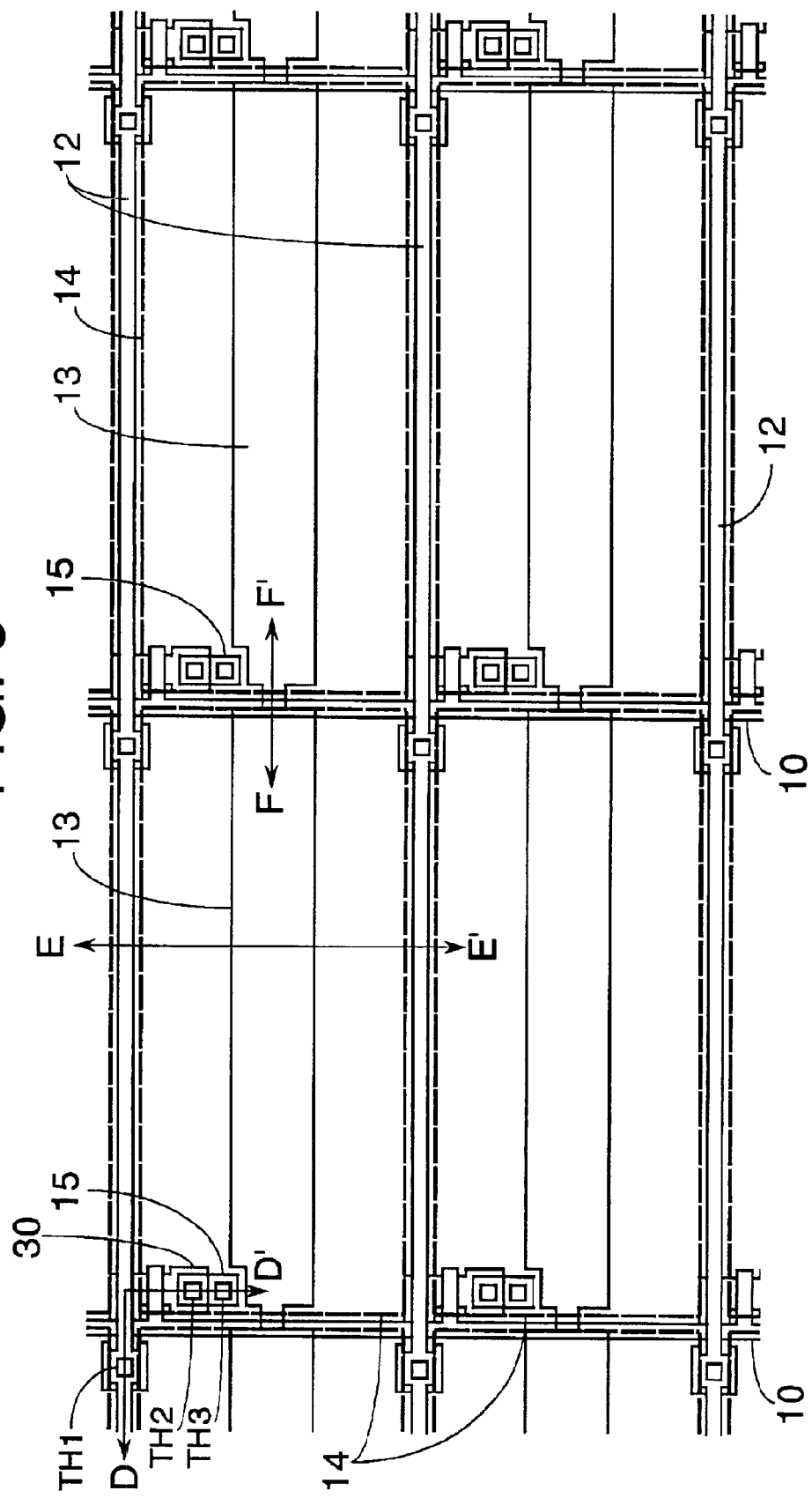

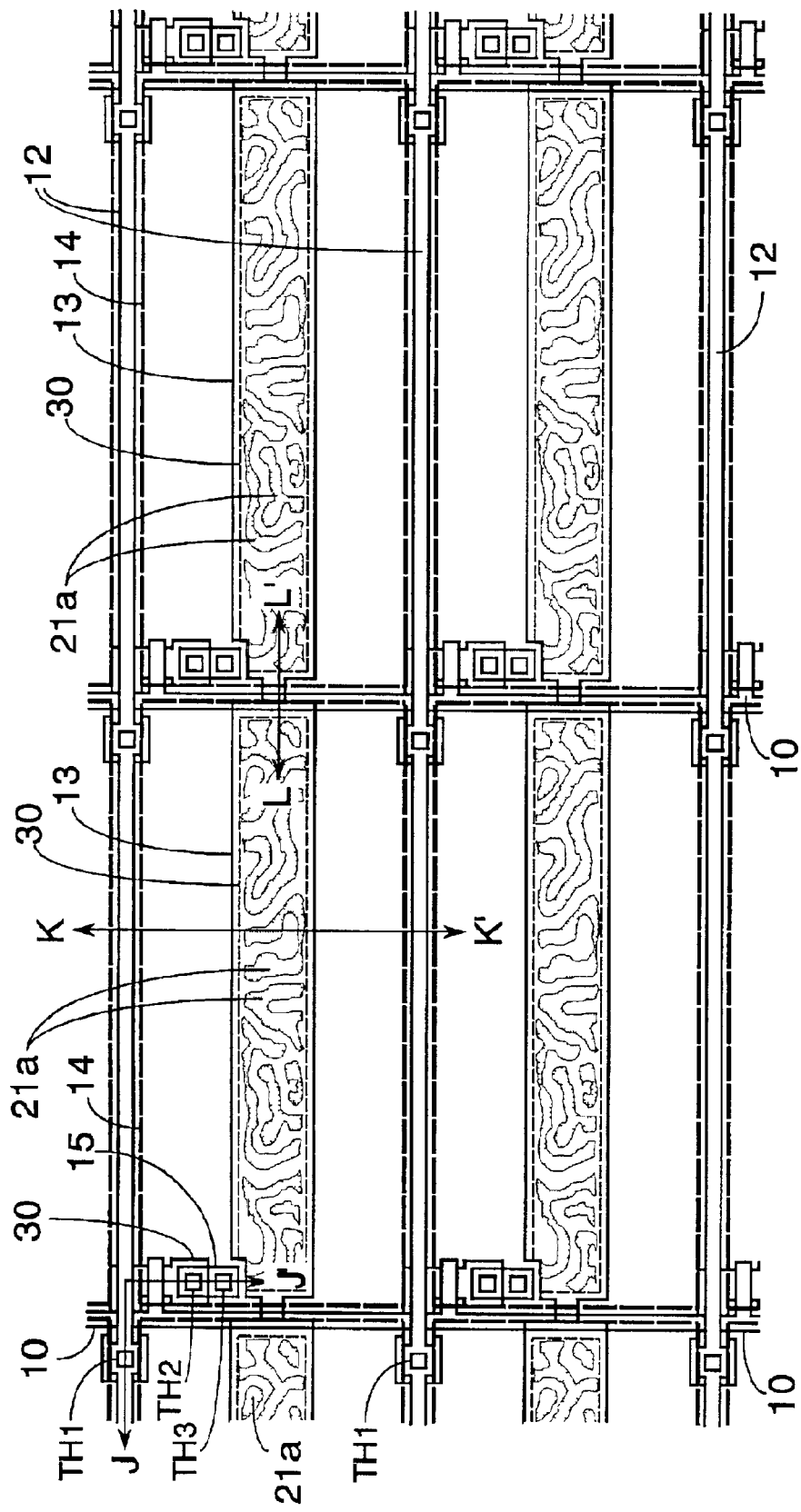

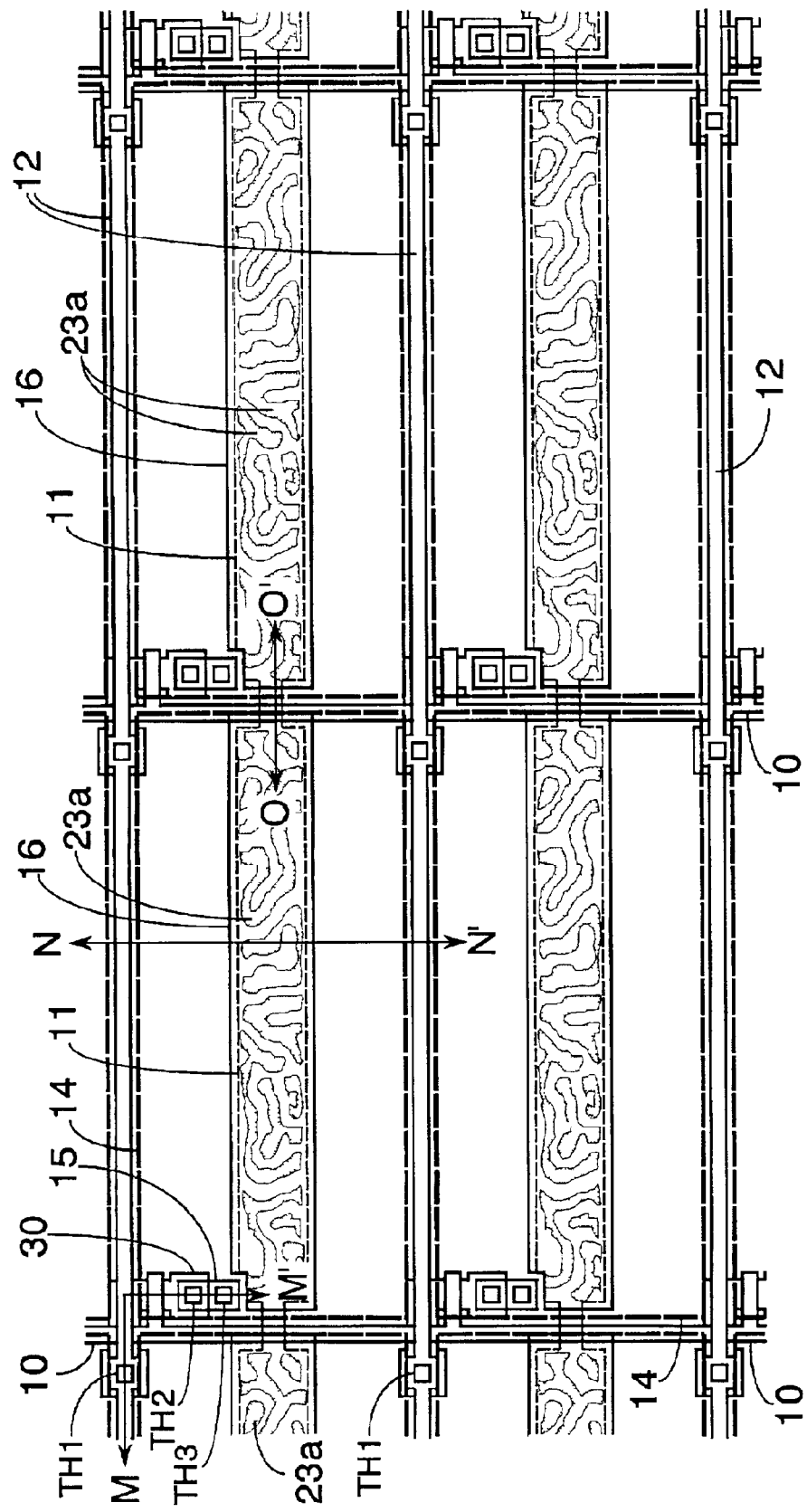

LIQUID CRYSTAL DISPLAY DEVICE

BACKGROUND OF THE INVENTION

1. Field of the Invention

The present invention relates generally to liquid crystal display devices and, more particularly to the structure of a liquid crystal display device of the partial transmission and partial reflection type having both a transmissive display region and reflective display region.

2. Description of the Related Art

Owing to unique features such as thin or slim size, light weight and low power consumption, liquid crystal display devices are becoming more widely used as display devices for display of image and character information in a variety of types of electronic equipment including but not limited to information equipment such as personal computers, portable information terminals, mobile wireless telephone handsets, and visual equipment such as digital cameras and camera-embedded VTR apparatus and others. In recent years, in accordance with noticeable rapid popularization of mobile telephone handsets and handheld information terminals, demands for middle or small size liquid crystal display devices with extra-low power consumption are becoming strong more and more.

Traditionally, for liquid crystal display devices adaptable for use in personal computers and liquid crystal monitors, a transmissive display mode is generally used for controlling a transmission amount of light as emitted from a back-light unit by a liquid crystal panel. However, electrical power being consumed by the backlight is ordinarily more than 50% of total power consumed by the liquid crystal panel, and is impermissible for small size equipment such as portable telephones, mobile information terminals or the like. Due to this, these devices are designed to employ reflection-mode liquid crystal display devices which eliminate use of the backlight and which include a reflective plate as provided at a panel surface for permitting reflection of ambient light rays to thereby visually display images.

These liquid crystal display device of the reflection type are faced with a problem as to a decrease in on-screen image viewability in cases where ambient light is dark. In the case of certain equipment such as portable telephones being subject to both outdoor use and indoor use, ambient light-independent usability is required. A liquid crystal display device for solving such problem is disclosed in JP-A-2000-19563, which device comes with a transmissive display region and a reflective display region within a single picture element or "pixel" to thereby simultaneously realize both a transmissive display function and a reflective display function.

In addition, as methodology for improvement of the viewability during reflective displaying, a method is disclosed in JP-A-2000-162637, wherein an organic resin film with formation of a convexo-concave configuration having a circular planar shape and moderate cross-sectional shape is disposed on a surface beneath a reflective electrode layer for scattering or dispersing reflected light into an appropriate direction(s).

The related art liquid crystal display devices of the partial transmission/reflection or "transflective" type are encountered with problems inherent thereto, including an occasional decrease in respective aperture ratios of reflective part and transmissive part as compared to display devices of complete reflection type and complete transmission type. Due to this, it is very important to enhance the total aperture ratio of a combination of the reflective and transmissive parts in order to achieve the required brightness or luminance of display images. Since pixel aperture ratios are significantly variable depending upon the planar layout of wiring lead electrodes and reflective electrode plus pixel electrodes, such design is important; however, no discussions on this point are found in the related art.

Alternatively in standard liquid crystal display devices of the active matrix type, a charge storage capacitance is customarily provided at each pixel in order to suppress interelectrode parasitic capacitance components and/or pixel voltage variations otherwise occurring due to transistor leakage currents to thereby obtain excellent display quality. While the significance and layout of such storage capacitance appreciably affects the resultant pixel aperture ratios, no teachings are involved in the related art as to how the charge storage capacitance is to be provided in partial transmissive/reflective pixels.

Also note that in order to fabricate the intended convexo-concave configuration having moderate sectional shapes by use of organic resin material, it should be required to add one or more extra process steps to prior known TFT fabrication processes, resulting in an unwanted increase in manufacturing costs.

SUMMARY OF THE INVENTION

It is therefore an object of the present invention to provide a new and improved structure of a partially transmissive and partially reflective liquid crystal display device capable of avoiding the problems stated above and also having high aperture ratios while enabling achievement of excellent on-screen display image quality with high production yields.

To attain the object, the present invention employs the means which follow:

(1) In a liquid crystal display device having a pair of substrates at least one of which is transparent and a liquid crystal layer as interposed between the pair of substrates, wherein one substrate of the pair of substrates is electrically insulative at least on its principal surface and comprises a plurality of scan electrodes which are formed on or over the insulative principal surface, a plurality of signal electrodes as formed to intersect the plurality of scan electrodes, a plurality of common electrodes, a plurality of thin-film transistors that are formed adjacent to cross points of the plurality of signal electrodes and the plurality of scan electrodes, a liquid crystal drive electrode (also called a pixel electrode) being disposed in a pixel region as defined by two neighboring scan electrodes and two neighboring signal electrodes and being connected to a respective one of the thin-film transistors, and an optical reflective film disposed at part within the pixel region, the liquid crystal display device having a function of driving the liquid crystal layer by a voltage as given to the liquid crystal drive electrode, featured in that the optical reflective layer is disposed at substantially a central portion midway between two neighboring signal electrodes while letting it have an almost rectangular planar shape as extended in a pixel elongate direction with a region lying between the reflective display region and two signal electrodes adjacent thereto being defined as a transmissive display region.

The term "almost rectangular planar shape" as used herein refers to the shape of an optical reflective layer within a principal or main surface (or alternatively within a virtual plane extending along it) of one of the pair of substrates opposing the liquid crystal layer, wherein this shape should not be limited only to rectangles and may also include those with at least one of four corner edges being rounded or replaced by curved shapes. For example, when letting the extension direction (first direction) of one of the pair of signal electrodes surrounding a pixel region and the extension direction (second direction) of one of the pair of scan electrodes be used as references, the optical reflection layer of the present invention is such that a maximal size along the first direction is different from a maximal size along the second direction.

(2) In the liquid crystal display device of (1), the optical reflective layer and the liquid crystal drive electrode are formed at different layers as separated by an insulative layer. The term "layer" as used herein refers to a hierarchy (level) with respect to the main surface of the substrate with the liquid crystal drive electrode and optical reflective electrode provided thereon, wherein one of these electrodes is disposed on the lower side of a prespecified insulative layer (this should not be limited to a single layer) whereas the other of these electrodes is on the upper side of the insulative layer. Layout of the two films (here, electrodes) in this way will be called "different layering" in the description.

(3) In the liquid crystal display device of (1), the optical reflective layer and the liquid crystal drive electrode are connected together, wherein the optical reflective electrode and a common electrode which is disposed on a lower layer thereof and is made of a material constituting the scan electrodes are laid out and wherein this common electrode and the optical reflective layer plus a dielectric layer interposed therebetween make up a charge storage capacitance.

(4) In the liquid crystal display device of (1), the optical reflective layer is arranged by use of part of an electrode material group constituting the signal electrodes, wherein an insulative film underlying the optical reflective layer is patterned into a prespecified recess-like shape to thereby cause the optical reflective layer to have optical diffuseability.

(5) In the liquid crystal display device of (4), the patterning shape of the insulative film underlying the optical reflective layer satisfies $1.0 \leqq A < 2.0$ in a relational equation of log $S = A \times \log L + B$, wherein L is the "peripheral" length of an individual pattern and S is an area thereof.

(6) In the liquid crystal display device of (5), either an electrode made of the same material as the scan electrodes or a semiconductor film constituting an active layer of the thin-film transistor is disposed at a level lower than the pattern of the insulative film.

(7) In the liquid crystal display device of (5) or (6), the optical reflective layer within the individual pixel is connected to optical reflective layers of two neighboring pixels in the pixel elongate direction.

(8) In the liquid crystal display device of (7), the mutually connected optical reflective layers are for use as a common electrode of the charge retaining capacitance, wherein this optical reflective layer and the liquid crystal drive electrode plus a dielectric layer sandwiched therebetween are used to form a charge retaining capacitor.

An effect of a respective one of the above-noted means will be explained below.

Firstly, the optical reflective layer is arranged using part of the electrode material group for constitution of the signal electrodes. With such an arrangement, it is no longer required to add any extra processes for provision of the optical reflective layer, which may contribute to reduction of manufacturing process steps while reducing production costs.

Further, more than one insulative layer are used to let the liquid crystal drive electrode and the optical reflective layer be subject to different layering by placing them at different levels to thereby separate functions of the electrode for liquid crystal drive and the optical reflective layer from each other. With such an arrangement, the area in which the liquid crystal layer is driven within a pixel is defined by a pattern of the liquid crystal drive electrode. On the other hand, the reflective display region within the pixel is defined by layout of the optical reflective layer causing part in which an optical reflective electrode is present within the pattern of the liquid crystal drive electrode when looked planarity to contribute to reflective display while letting part with the lack of any optical reflective electrode contribute to transmissive display.

The design for arranging the optical reflective layer using the same material as that of the signal electrodes while causing the liquid crystal display electrode to reside at a different level from the optical reflective layer due to the presence of more than one insulative film would result in the liquid crystal display electrode also being made different in level from the signal electrodes. Due to this, no specific problems occur in display functions even when designing the pattern of liquid crystal display electrode so that it overlaps the pattern of signal electrodes. Thus it is possible to maximize the area of the liquid crystal drive electrode, which in turn makes it possible to expand the total aperture ratio.

On the other hand, the optical reflective layer and the signal electrodes are formed on the same layer. In order to preclude electrical shorting defects therebetween, a need is felt to let these patterns be spaced apart from each other by a certain degree. Pixels of liquid crystal display devices are designed in many cases to have the so-called longitudinal stripe type planar shape with its aspect ratio of 3:1. In view of this, the optical reflective layer is formed into an almost rectangular pattern as extended to cover the full length along the elongate direction of this longitudinal stripe-shaped pixel while letting it be disposed at substantially a central portion midway between two adjacent signal electrodes, whereby it is possible to maximize the area of a reflective display unit while at the same time increasing a distance between the optical reflective layer and a signal electrode associated therewith. Since a region between the optical reflective layer and the signal electrode automatically becomes a transmissive display region, the resultant ratio of a reflective area to transmissive area may be freely designed through adjustment of a short axis length of the almost rectangular optical reflective layer.

In the related art, either a reflective display unit or transmissive display unit is merely provided at the center of a pixel, with the lack of any sufficient considerations relative to maximization of the total aperture ratio. When comparing such related art to the liquid crystal display device in accordance with the present invention, major arrangements of the liquid crystal display device of this invention may also be described in a way which follows.

In accordance with one aspect thereof:

(9) In a liquid crystal display device comprising a pair of substrate and a liquid crystal layer as interposed between this pair of substrates, one of the pair of substrates has on its principal surface a plurality of parallel scan electrodes extending in a first direction and being provided along a second direction intersecting the first direction, a plurality of parallel signal electrodes extending in the second direction and being provided in the first direction, and a plurality of pixel regions each surrounded by a pair of neighboring ones of the plurality of scan electrodes and a pair of neighboring ones of the plurality of signal electrodes, a respective one of the plurality of pixel regions is provided with a liquid crystal drive electrode for receiving an image signal corresponding to (to be supplied to) the pixel region from one of the plurality of signal electrodes and for permitting input of the image signal from an active element as controlled by one of the plurality of scan electrodes and at least one optical reflective layer being less in area than the liquid crystal drive electrode for causing reflection of incident light from a remaining one of the pair of substrates, and the optical reflective layer (a) extends along a pair of an increased length along the pixel region of a pair of ones of the plurality of signal electrodes surrounding the pixel region with the optical reflective layer provided therein and a pair of ones of the plurality of scan electrodes and (b) is spaced apart from respective ones of the length-increased pair along the pixel region.

According to another aspect:

(10) In a liquid crystal display device which comprises a first substrate and a second substrate along with a liquid crystal layer interposed between the first and second substrates, the first substrate has on its principal surface a plurality of parallel scan electrodes extending in a first direction and being provided along a second direction intersecting the first direction, a plurality of parallel signal electrodes extending in the second direction and being provided in the first direction, a plurality of pixel regions each surrounded by a pair of neighboring ones of the plurality of scan electrodes and a pair of neighboring ones of the plurality of signal electrodes and being elongated in the second direction to have a length along this direction greater than that along the first direction (in other words, its elongate direction is along the extension direction of the signal electrodes), and a plurality of active elements receiving an image signal from one of the plurality of signal electrodes and being controlled by one of the plurality of scan electrodes, a respective one of the plurality of pixel regions is provided with a liquid crystal drive electrode for receiving the image signal from one of the plurality of active elements and at least one optical reflective layer for permitting reflection of incident light from the second substrate, and the optical reflective layer is spaced apart from respective ones of a pair of ones of the plurality of signal electrodes surrounding the pixel region with this optical reflective layer provided therein.

In these liquid crystal display devices of (9) and (10), it is preferable that the liquid crystal drive electrode is provided on the liquid crystal layer side than the optical reflective layer with respect to the substrate main surface with this electrode provided thereon while letting the liquid crystal drive electrode extend to overlie at least one of a pair of signal electrodes and a pair of scan electrodes surrounding the pixel region and further letting it extend also at upper part of either one of these electrodes. Alternatively the liquid crystal drive electrode may be extended along a direction crossing the elongate direction of the pixel region to cover the optical reflective layer, with the pixel region being divided in this extension direction into portions including a transmissive display portion, reflective display portion and transmissive display portion in this order of sequence. Still alternatively the optical reflective layer may be extended in the elongate direction of pixel region to go beyond the contour of a black matrix (an opening of a light shield film corresponding to the pixel region) by way of example and further be electrically connected to an optical reflective layer of another pixel region that neighbors in this elongate direction. More specifically in a specified pixel region, the optical reflective layer may be electrically isolated from the liquid crystal drive electrode for utilization to electrical charge retaining of the liquid crystal drive electrode, for example.

Next, in regard to addition of optical diffuseability, a specific structure is employed for patterning an underlying insulative film of the optical reflective layer into a prespecified recess-like shape. This method is achievable by mere modification of a photo-mask(s) to be used in the manufacture of the related art TFTs while requiring no increases in process steps, thus enabling reduction of fabrication process steps required therefor, which in turn contributes to reduction of production costs. Traditionally a method is known of patterning a member constituting a TFT to thereby form a convexo-concave pattern in a reflective electrode while letting it be disposed beneath the reflective electrode. Unfortunately, with the convexo-concave configuration as fabricated by such method, the resulting cross-sectional shape often fails to be sufficiently smooth, resulting in the light diffuseability being kept deficient. For instance, it is difficult to fabricate using inorganic films such as $SiO_2$ or else any smooth sectional shape such as obtainable by organic resin materials. Due to this, a major trend in many cases is to employ a method of forming smooth convexo-concave configuration in organic resin material.

However, the inventors as named herein have discovered that the cause of the unavailability of any sufficient light diffusion performance by use of prior known inorganic-film fabrication patterns lies in the presence of a problem as to the planar shape. Traditionally the convexo-concave planar patterns are of a circular shape or other similar shapes thereto. One example is that in cases where a $SiO_2$ film is etched to have a recess-like shape, its etched bottom surface portion and etching-failed film surface become flat surfaces, causing a reflective electrode as formed thereon to have no diffuseabilities. On the other hand, an edge portion of such recess shaped pattern is tapered with a certain angle, permitting a reflective electrode formed at this portion to contribute to light diffuseability. Accordingly, in order to obtain sufficient light diffuseability, it should be required that the pattern's edge portion be lengthened sufficiently. Nevertheless, with traditionally used circular pattern shapes or other similar ones, the peripheral length of a pattern is not so large with respect to an occupation area of the pattern; with such shapes, it is hardly possible to sufficiently enlarge the length of a pattern edge portion(s) for addition of the diffuseability required.

With such two-dimensional (2D) patterns, the peripheral length L and pattern area S typically satisfy a relation defined by Equation (Eq. 1) which follows.

$$\log L \propto 2 \cdot \log S \tag{1}$$

For example, letting the pattern be a circle with its radius r, its area S1 may be represented by Equation 2 below.

$$S1 = \pi \times r^2 \tag{2}$$

In view of the fact that the circumference P is given as $P=4\pi r$, the relation of Equation 2 may be written into Equation 3 below.

$$S1 \propto P^2 \tag{3}$$

In this way, Equation 3 satisfies the relationship defined by the above Equation 1. Although a similar relation is established with square or polygonal patterns other than circles, the use of these pattern shapes makes it difficult to add any satisfiable light deffuseabilities. Then, with the present invention, the shape of pattern for addition of diffuseability is set based on Equation 4 which follows.

$$\log S = A \times \log L + B \quad (4)$$

In this Equation 4, a specific pattern shape is especially desirable which causes a factor "A" to satisfy the following inequality.

$$1.0 \leq A < 2.0 \quad (5)$$

Here, "A" is a parameter that indicates how the peripheral length and pattern area increase, which in turn shows that a pattern satisfying the above relationship is such that an increase in pattern occupation area will not so significantly increase even when the peripheral length becomes longer. Thus it is possible to enlarge the packing density of such pattern, which makes it possible to efficiently add the light diffuseability required.

Next, either an electrode made of the same material as that of the scan electrodes or a semiconductor film making up the active layer of the thin-film transistor was disposed at a lower layer of the above-noted recess-like pattern. This electrode layer or semiconductor layer functions as an etching stopper of insulating layers, which prevents excessive progress of etching up to an underlying film(s). A glass substrate containing Ba and/or Ca exists at a lowermost layer. Upon progressing of etching to reach the glass substrate, these alkali earth metals can undesirably behave to contaminate TFTs and/or manufacturing apparatus. To avoid this, the etch stopper layer is required.

In addition, each pixel's optical reflective layer is connected to optical reflective layers of two neighboring pixels in the elongate direction of the pixels while letting the mutually connected optical reflective layers serve as a common electrode of charge retaining capacitance, with this common electrode and the liquid crystal drive electrode plus a dielectric layer sandwiched therebetween forming a charge retaining capacitance component.

Using in this way the optical reflective layer as the common electrode while letting it be disposed to extend in a parallel direction to the signal electrodes makes it possible to lessen a load capacitance per common electrode when compared to that in the case where the common electrode is extended in parallel to the scan electrodes.

This provides significant advantages in low power consumption LCDs for use in portable or handheld telephone handsets and mobile information equipment. In order to achieve low power consumption, it is inevitable to potentially reduce the power supply voltage as supplied thereto. To lower a drive voltage for application to the liquid crystal layer, it is effective to employ the so-called common inversion drive scheme for performing a drive operation while letting the voltage of a common electrode on an opposing or "counter" substrate be synchronized with a voltage waveform of the liquid crystal drive electrode, rather than setting it at a constant value. To supply a right drive voltage to the liquid crystal layer by such common inversion drive scheme with respect to LCDs made up of pixels each having a charge retain capacitance, it is also required to drive the common electrode of such charge retain capacitances simultaneously during driving of the common electrode of the counter substrate.

When paying attention to a scan line being presently selected in the common inversion drive by line sequence scanning techniques, in case the common electrode is extended in parallel to the scan electrodes, the load capacitance when looking at a common electrode corresponding to the selected scan line from the input side becomes equal to a sum of a charge retain capacitance of a single line of pixels being connected to the selected scan line and a liquid crystal layer capacitance plus a cross-over capacitance of the common electrode and its associated signal electrode. Additionally the capacitance per single common electrode corresponding to a non-selected scan line is given by zero approximation as a sum of cross capacitances of the common electrode and signal electrode. This capacitance has an extremely small value when compared to the capacitance of the common electrode corresponding to the selected scan line.

On the other hand, in case the common electrode is disposed so that it extends in a direction parallel to the signal electrode, the capacitance per single common electrode becomes equal to a sum of the cross capacitance of common electrode and scan electrode and the charge retain capacitance of a single pixel plus the liquid crystal layer capacitance, which is equal with respect to all the common electrodes concerned.

Although a total capacitance of all the common electrodes is equal irrespective of extension directions of the common electrodes, in case the common electrodes are extended in parallel to the scan electrodes, since the common electrode corresponding to a presently selected scan line of the capacitances of common electrodes is greater in capacitance than the remaining common electrodes corresponding to non-selected scan lines, when the common electrode resistance value is not sufficiently small, there is the possibility that lateral directional shadowing takes place due to signal delays, resulting in occurrence of image quality defects. On the other hand, in case the common electrodes are disposed and extended in a direction parallel to signal electrodes, the capacitance per common electrode is equal relative to all the common electrodes and becomes a small value. Due to this, the above-noted image quality problems due to signal delays will no longer occur.

These and other objects, features and advantages of the invention will be apparent from the following more particular description of preferred embodiments of the invention, as illustrated in the accompanying drawings.

BRIEF DESCRIPTION OF THE DRAWINGS

FIG. 1 is a pixel plan view of the liquid crystal display device related to a first embodiment of the present invention;

FIGS. 2A to 2C are pixel cross-sections of the liquid crystal display device related to the first embodiment of the present invention, wherein FIG. 2A illustrates a cross-section as taken along a line A–A' of FIG. 1, FIG. 2B illustrates a cross-section as taken along a line B–B' of FIG. 1 and FIG. 2C illustrates a cross-section as taken along line C–C' of FIG. 1, respectively;

FIG. 3 is a pixel plan view of the liquid crystal display device related to a second embodiment of the present invention;

FIGS. 4A to 4C are pixel cross-sections of the liquid crystal display device related to the second embodiment of the present invention, wherein FIG. 4A illustrates a cross-section as taken along a line D–D' of FIG. 3, FIG. 4B illustrates a cross-section as taken along a line E–E' of FIG. 3 and FIG. 4C illustrates a cross-section as taken along line F–F' of FIG. 3, respectively;

FIGS. 6A to 6C are pixel cross-sections of the liquid crystal display device related to the third embodiment of the present invention, wherein FIG. 6A illustrates a cross-section as taken along a line G–G' of FIG. 5, FIG. 6B illustrates a cross-section as taken along a line H–H' of FIG. 5 and FIG. 6C illustrates a cross-section as taken along line I–I' of FIG. 5, respectively;

FIG. 10 is a pixel plan view of the liquid crystal display device related to a fourth embodiment of the present invention;

FIGS. 11A to 11C are pixel cross-sections of the liquid crystal display device related to the fourth embodiment of the present invention, wherein FIG. 11A illustrates a cross-section as taken along a line J–J' of FIG. 10, FIG. 11B illustrates a cross-section as taken along a line K–K' of FIG. 10 and FIG. 11C illustrates a cross-section as taken along line L–L' of FIG. 10, respectively;

FIG. 12 is a pixel plan view of the liquid crystal display device related to a fifth embodiment of the present invention;

FIGS. 13A to 13C are pixel cross-sections of the liquid crystal display device related to the fifth embodiment of the present invention, wherein FIG. 13A illustrates a cross-section as taken along a line M–M' of FIG. 12, FIG. 13B illustrates a cross-section as taken along a line N–N' of FIG. 12 and FIG. 13C illustrates a cross-section as taken along line O–O' of FIG. 12, respectively;

DETAILED DESCRIPTION

Figure 2A:
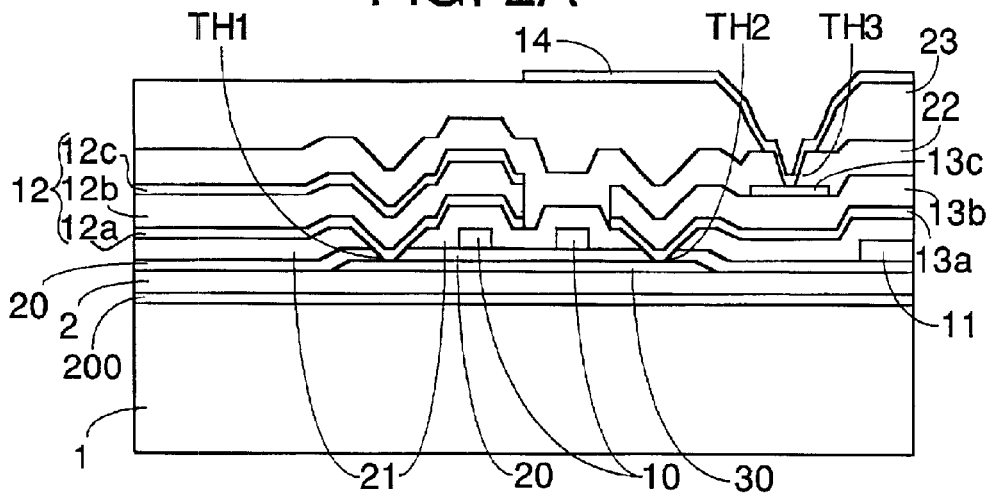

Several embodiments of the present invention will now be explained in detail with reference to the accompanying drawings below. In the description, like parts and parts performing similar functions are referenced with like reference characters, with any repetitive explanations eliminated.

<Embodiment 1>

Figure 2B:
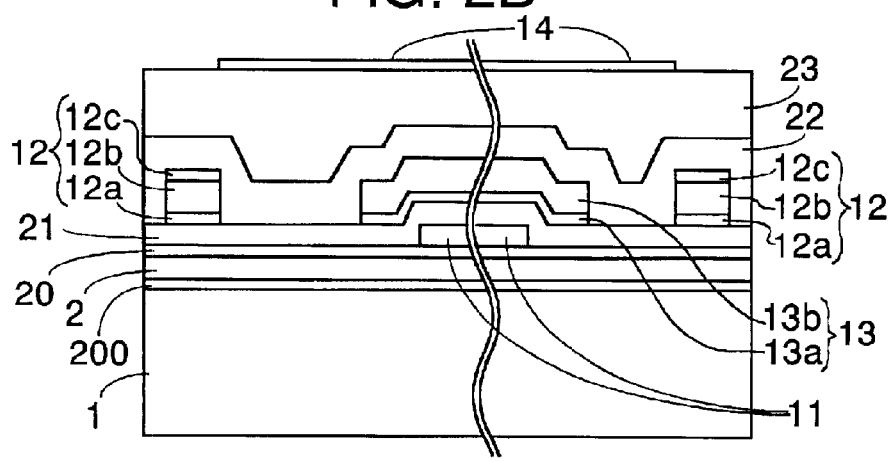
Figure 2C:
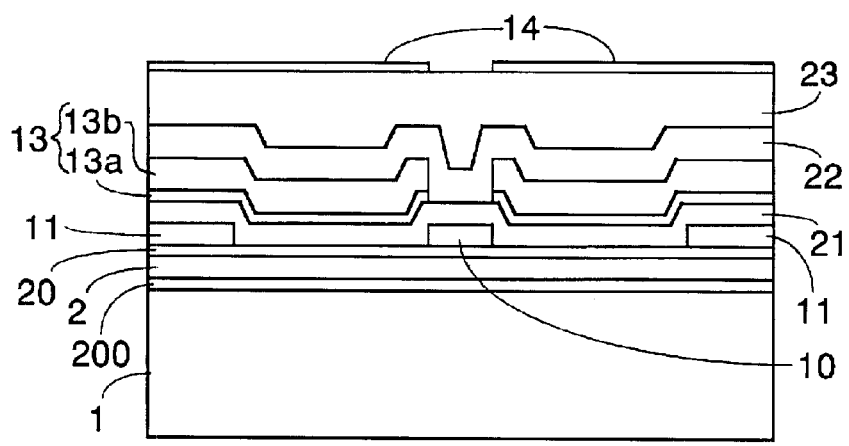

FIG. 1 is a diagram showing a plan view of a unitary picture element or "pixel" of a liquid crystal display device in accordance with a first embodiment of the instant invention, and FIGS. 2A to 2C are diagrams each depicting a cross-sectional view of the pixel. FIGS. 2A to 2C illustrate sectional structures (i.e. sectional views resulted from cut-away along lines each having arrows at its both ends) as taken along lines A–A', B–B' and C–C' of FIG. 1, respectively. Note here that the plan view of FIG. 1 (planar structures of pixel regions at four locations are shown so that these are disposed into an array) and each sectional view of FIGS. 2A to 2C illustrate only one substrate, called a TFT substrate, of a pair of substrates with a layer of liquid crystal material interposed therebetween, on which active elements (here, thin-film transistors or alternatively field effect transistors known as FETs) are formed for control of a display operation of each pixel, with the liquid crystal layer and the remaining one of the paired substrates eliminated from the illustration. Also note that in the sectional views of the TFT substrate, depiction of an optical polarization plates or the like to be multilayered on or over one of its two principal or main surfaces (upper and lower surfaces)—namely, a main surface on the opposite side to the liquid crystal layer—is omitted therein.

An entirety is formed on an insulating film for use as a buffer layer which is constituted from a $Si_3N_4$ film 200 with a film thickness of 50 nm and a $SiO_2$ film 2 of 120 nm thick over a no-alkali glass substrate 1 with a distortion point of about 670° C. The buffer insulating film serves to prevent unwanted diffusion of impurities such as Na or else from the glass substrate 1.

On the buffer insulating film 21 is formed a polycrystalline silicon (referred to as "poly-Si" hereinafter) film 30 with a film thickness of 50 nm for constituting thin-film transistors (TFTs), wherein a scan wiring lead electrode (also called "scan signal line" or "gate signal line") 10 made of molybdenum (Mo) with a film thickness of 200 nm is formed over each poly-Si 30 through a 100-nm thick gate insulation film 20 made of $SiO_2$. In addition, common electrodes (also known as opposing or "counter" electrodes in case each opposes either a pixel electrode to be described later or an electrode conducted thereto) 11 of charge storage capacitances are formed by use of the same Mo as the scan lead electrodes 10. In the plan view diagram of FIG. 1, contour lines of the common electrodes 11 are indicated by dotted lines. An interlayer dielectric film 21 made of 400-nm thick $SiO_2$ is formed to cover all of the above-noted members. Via contact through-holes TH1, TH2 as provided in the interlayer dielectric film 21, a signal lead electrode (also called an "image signal line" or "data signal line") consisting essentially of a three-layered metal films of Mo (designated by 12a)/Al (aluminum, denoted by 12b)/Mo (denoted by 12c) and a reflective electrode 13 also for use as a source electrode are connected to source/drain layers which are provided at part of the poly-Si layer. Of the Mo/Al/Mo three-layer metal film making up the reflective electrode 13, the Mo film 13a underlying the Al film 13b is provided for decreasing a contact resistance between the poly-Si film 30 and Al whereas the Mo film 13c overlying the Al is for reduction of a contact resistance between a source electrode 15 (a three-layer metal film of Mo/Al/Mo formed as part of the reflective electrode 13) and a pixel electrode 14.

It should be noted that the indication of "Mo/Al/Mo" in the description is a representation which shows a material profile of a layer formed of a lamination of more than two kinds of films on or over the substrate main surface in such a manner that a slash ("/") mark is used to sequentially separate between adjacent ones of respective stacked layer materials from the substrate main surface. One example is that a layer having a material profile of Mo/Al is formed by sequential lamination of a Mo film and an Al film in this order of sequence from the substrate main surface. Such a representation will be applied not only to this embodiment but also to other embodiments as will be later described.

Although in the TFTs having the field-effect transistor structure shown in FIG. 1 and FIG. 2A the above-noted source layer and drain layer are such that their functions are interexchangeable in accordance with voltage potentials of the both, a specific side which receives a signal voltage from a signal electrode will be called the drain layer or alternatively drain electrode for explanation purposes only whereas a side for receipt of such signal voltage through the channel of a TFT (a portion placed on the lower side of a scan electrode 10 of a poly-Si layer (semiconductor layer) 30 shown in FIG. 2A) will be called the source layer or source electrode in the description, not only in this embodiment but also in the other embodiments. Although in this embodiment the channel was formed as the poly-Si (polycrystalline silicon), this may be replaced by a-Si (amorphous silicon); the scan lead electrode may be provided on the lower side of the semiconductor layer 30 or alternatively a film made of insulative material or dielectric material may be provided between the scan lead electrode 10 and the semiconductor layer 30 as far as its voltage change is capable of modulating the strength distribution of an electric field within the poly-Si layer, that is, the semiconductor layer 30. In FIG. 2A, two scan lead electrodes 10 are formed over the semiconductor layer 30. It would be apparent from the part along line A–A' of FIG. 1 that one of these two scan lead electrodes 10 acts as the so-called main line which extends along a plurality of parallel-provided pixel regions, and the other of them becomes a branch line projecting from this main line into a certain one pixel region. However, in view of the fact that the same voltage is applied to these two signal lead electrodes, both of them contribute to control of the behavior of carriers (electrons and holes) within the semiconductor layer 30 that is provided beneath them. To be brief, it is possible to assume the thin-film transistor that is employed in this embodiment as a field effect transistor having two gate electrodes. Additionally this field effect transistor's channel is defined as two portions which are placed on the lower side of the two signal lead electrodes 10 of the semiconductor layer 30, wherein in FIG. 2A the portion neighboring upon the left of a left-side channel of the semiconductor layer 30 (left-side edge of semiconductor layer 30) corresponds to the drain layer whereas part neighboring upon the right of a right-side channel of the semiconductor layer 30 (right edge of semiconductor layer 30) corresponds to the drain layer, respectively.

The upper layer Mo film 13c of the reflective electrode 13 which can also do double-duty as the source electrode 15 is such that it is left only at a contact portion with an ITO film forming a pixel electrode 14 to be later described and its peripheral portion(s) while letting it be removed away at large part of the remaining portions. With such an arrangement, it was possible to achieve high light reflectivity. In the illustrative embodiment the reflective electrode 13 is constituted from the so-called multilayer structure with a first conductive film made of appropriate material for reduction of contact resistance relative to the semiconductor layer being formed on the main surface side of the substrate and a second conductive film higher in reflectivity than the first conductive film on the upper side (the liquid crystal layer side than the first conductive layer) of this first conductive film respectively. Accordingly, as long as the material of this first conductive film exhibits excellent ohmic contact with respect to the semiconductor layer, Mo is replaceable with Mo-containing alloys, high-melting-point metals other than Mo or the alloys thereof (refractory metals or refractory alloys), metals such as tantalum (Ta), niobium (Nb), tungsten (W) and the like, or chromium (Cr) or its alloys. The second conductive film is not necessary in the degree that in accordance with specifications of the liquid crystal display device, the first conductive film performs its functions—that is, it allows incident light onto the TFT substrate main surface through the liquid crystal layer to reflect toward the liquid crystal layer causing this reflected light to radiate toward the outside of the liquid crystal display device from the other substrate (the so-called transparent substrate having sufficient optical transmissivity) opposing the TFT substrate with an intensity large enough to enable users to visually recognize resultant on-screen display images. However, in case this output light intensity is deficient, the second conductive film made of a chosen material higher than the material of the first conductive film in ratio (reflection factor) for reflection of incident light onto its surface is multilayered on or over the first conductive film. This multilayer form is advantageous in particular in cases where the first conductive film is made of the material with the so-called light shielding properties.

The second conductive film is such that no problems occur even when the contact resistance relative to the semiconductor layer for example is higher than the above-noted first conductive film as far as the prescribed reflection factor conditions are satisfied. For instance, it should not be limited only to the Al and may alternatively be made of Al alloys, copper (Cu) or its alloys. It must be noted that in case part of the reflective electrode 13 functions also as the source electrode 15 and is formed at the same level (upper surface of the interlayer dielectric film 21) as the signal lead electrodes 12 as in this embodiment, these electrodes are formed of the above-stated first conductive film and second conductive film; further, in the signal lead electrode 12 and source electrode 15, a third conductive film of different material from the second conductive film is multilayered on or over the second conductive film when the need arises. In particular in the source electrode 15, it is desirable that the third conductive film be formed using certain materials having physical properties near to the first conductive film when compared to the second conductive film—in view of process technologies, the same material as the first conductive film—in order to take electrical contact with the semiconductor layer of oxides such as the ITO and/or indium-zinc oxides. Further, depending upon process conditions, each of the signal lead electrode 12, reflective electrode 13 and source electrode 15 may be formed of a film of copper (Cu) or its alloys. The selection conditions of these materials are applied not only to this embodiment but also to the remaining embodiments to be later described, on a case-by-case basis.

In the process described above, more than one element thus formed on the TFT substrate main surface has an upper surface which is almost entirely coated by a protective insulating film 22 made of $Si_3N_4$ with a film thickness of 200 nm and an organic protective film 23 mainly comprised of acrylic resin material with a film thickness of 2 $\mu$m. Further a pixel electrode 14 made of indium tin oxide (ITO) is connected to the source electrode 13 of the TFT through a contact through-hole TH3 that is provided in the protective insulating film 22 and organic insulating film 23 (a contact portion between the above-stated Mo film 13 and ITO film).

The reflective electrode 13 which also functions as the source electrode is disposed substantially at a central portion lying midway between two neighboring signal electrodes 12 to thereby define a reflective display region as an almost rectangular planar shape that is extended in the elongate direction of a pixel(s), thus providing a planar arrangement which defines the reflective display region and a transmissive display region corresponding to a region between two signal lead electrodes neighboring thereto (for example, the region for permitting penetration of light from a back-light unit as equipped to the liquid crystal display device). Additionally a charge storage capacitor is formed by the reflective electrode 13 and a charge storage capacitance common electrode 11 plus the interlayer dielectric film 21 sandwiched therebetween.

In addition, the pixel electrode 14 is so formed as to cover almost an entire surface of the pixel region as surrounded by two signal lead electrodes 12 and two scan lead electrodes 10. In any one of FIG. 1 (plan view of this embodiment) and plan view diagrams (FIGS. 3, 5, 10 and 12) in respective embodiments as will be described later, contour lines of the pixel electrode 14 are indicated by dotted lines.

By arranging the reflective electrode 13 using the same material as the signal lead electrodes 12, it is possible to simplify the manufacturing process. It is also possible to prevent electrical shorting between the optical reflective layer and signal electrode(s) by designing the optical reflective layer to have an almost rectangular pattern that is extended along the entire part of the elongate direction of this longitudinal stripe type pixel and then disposing this reflective layer at substantially a central portion between two signal electrodes. In addition, by forming the pixel electrode 14 for driving liquid crystals in such a way as to cover almost the entire surface of a pixel region surrounded by two signal lead electrodes and two scan lead electrodes, it is possible to permit the region between the optical reflective layer and a signal electrode to function as a transmissive display region, which in turn makes it possible to enlarge the total aperture ratio. Note here that an area ratio of reflection to transmission may be freely designed by mere adjustment of a short axis length of the optical reflective layer with almost rectangular shape.

These advantages are obtainable by letting in the pixel region the reflection electrode 13 (optical reflective layer) be spaced apart from a pair of signal electrodes with this pixel region being interposed between them and by using a region interposed between this reflection electrode 13 and a respective one of the pair of signal electrodes as an optical transmissive region. It is desirable that a width for letting the individual one of the pair of signal lead electrodes 12 and the reflection electrode 13 interposed between them be set at least identical to the width of a signal lead electrode or greater than it. In another point of view, the above advantages are achievable by establishing in a single pixel region the parallel provision of a transmissive display region and a reflective display region plus a transmissive display region from one of a pair of signal electrodes 12 surrounding this pixel region along at least one of a pair of scan electrodes 10 surrounding this region. Insofar as transmissive display regions (two per pixel region) are provided along respective ones of the pair of signal electrodes 12 surrounding this single pixel region in such a manner that they neighbor upon the electrodes, it is permissible to provide therebetween a plurality of reflective display regions and transmissive display regions (in addition to the above-noted two regions) for letting them be spaced apart from each other. Note here that although in this embodiment a discussion was made as to the scan electrode 10 neighboring upon a single pixel region in relation to the case where the signal electrode 12 adjacent thereto is made longer, in the event that this scan electrode is lengthened to an extent that it is longer than this signal electrode, it will be recommendable that the reflection electrode 13 is spaced apart from this scan electrode 10 on the contrary to the above-stated case while establishing parallel provision of a transmissive display region and a reflective display region plus a transmissive display region in this order along this signal electrode 12. Additionally, in a viewpoint of prevention of interference and interaction between the reflection electrode 13 that is provided in the pixel region and a pair of signal electrodes 12 with this pixel region interposed therebetween or alternatively arrangement of a capacitive element using this reflection electrode 13 and a scan electrode 10 used for display control of a pixel region adjacent thereto, it is desirable that as in this embodiment the pair of signal electrodes 12 surrounding the pixel region be longer than the pair of scan electrodes 10 surrounding the same while letting the size of the reflection electrode 13 along the extension direction ("x" axis of FIG. 1) of signal electrode 12 be longer than the size thereof along the extension direction (y axis of FIG. 1) of such scan electrode.

Although in this embodiment the reflection electrode 13 (optical reflective layer) is designed to have an almost rectangular shape, this shape may be replaced by a rectangle with its four corners rounded for example—or alternatively, other shapes may be used in place of curved shapes, including but not limited to octagonal shapes or shapes resembling ellipses by way of example. In this case, the size of the reflection electrode 13 in a long axis direction is replaced for example with a maximal value of the length along the extension direction (x axis) of the signal electrode 12 of FIG. 1 (for example, its long axis in case the rectangular reflection electrode 13 of FIG. 1 is replaced by an ellipse) whereas the size in a short axis direction is replaced with a maximal value of the length along the extension direction (y axis) of the scan electrode 10 of FIG. 1 (e.g., its short axis when the rectangular reflection electrode 13 of FIG. 1 is replaced by an ellipse).

When compared to the optical reflective layer structure of a pixel region of the related art reflection type liquid crystal display device with an annular optical reflective layer provided at the periphery of the pixel region, the optical reflective layer structure of the illustrative embodiment with this being spaced apart from at least its neighboring signal lead electrode is such that the possibility of capacitive coupling between the reflection electrode and signal lead electrode is reduced resulting in longitudinal smear (shadowing) being hardly generated on a display screen.

On the other hand, disposing the common electrode 11 at a lower layer of the reflection electrode 13 makes it possible to form the required charge storage capacitance having a relatively large capacitance value without accompanying risks of bad influence upon the aperture ratio. In a pixel region(s) of the liquid crystal display device, in order to maintain the pixel electrode—namely the electrode for application of a predefined voltage to the liquid crystal layer in accordance with an output from the aforesaid active element—at a desired potential level (including a variation in an allowable error range) within a predetermined length of time period (for example, a period spanning from start-up of display of a single image up to switching to display of the next image: say, one frame period), the pixel electrode or an electrode conducted thereto and an electrode having a potential level different therefrom (desirably, less in potential variation within the above-defined time period) are used to form a capacitive element or the one similar thereto. This capacitive element is also called the charge storage capacitor or additional capacitor, an example of which is a capacitive element as formed using the above-stated reflection electrode 13 and a scan electrode 10 used to control a capacitive element of another pixel region adjacent to the pixel region in which this reflection electrode is provided. The charge storage capacitor functions to suppress pixel voltage fluctuation otherwise occurring due to leakage currents of TFTs and/or liquid crystal layer and pixel voltage variation due to cross-talk from scan and image signals, and contributes to improvements in image quality. Since in this embodiment the pixel electrode 14 is provided on the upper side (the liquid crystal layer side which is not illustrated) of the reflection electrode 13, it is also possible in the so-called reflective display region also to permit the pixel electrode 14 to offer an ability to control the alignment or orientation direction of liquid crystal molecules in the liquid crystal layer while letting the reflection electrode 13 function to retain the potential of this pixel electrode 14.

With the advantage stated above, it was possible to arrange the intended partial transmissive/reflective or "transflective" liquid crystal display device with increased aperture ratios and enhanced brightness.

<Embodiment 2>

Figure 4A:
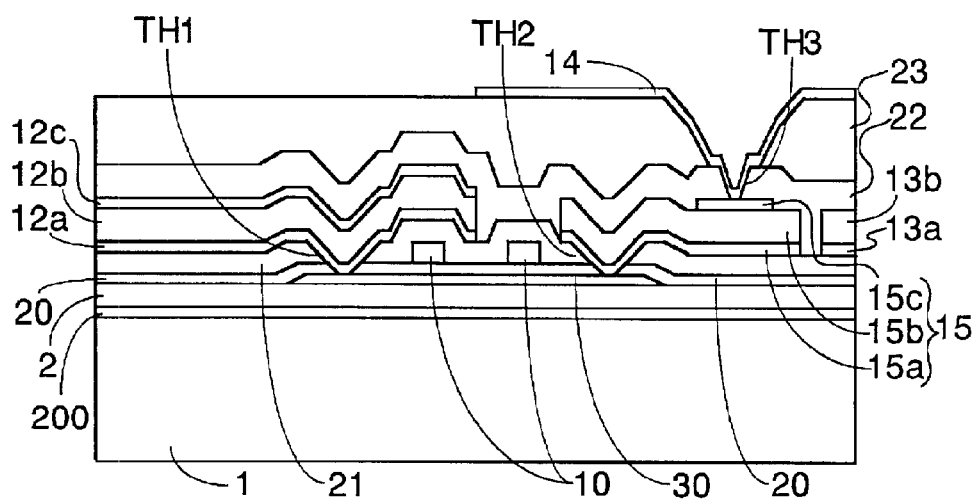
Figure 4B:
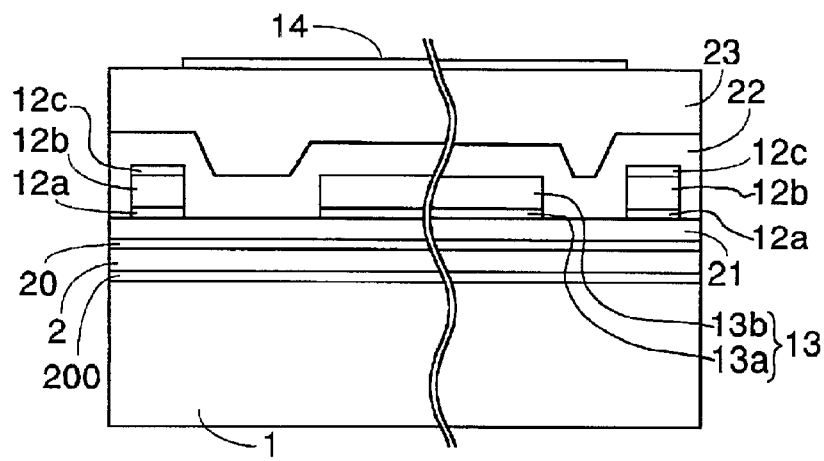
Figure 4C:
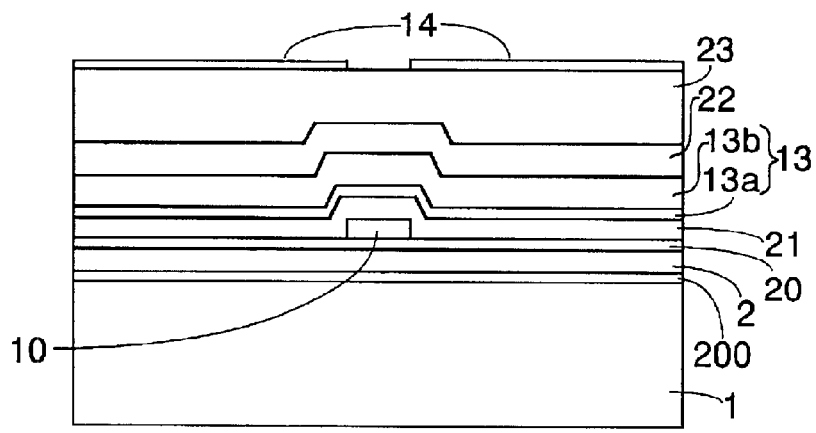
Figure 5:
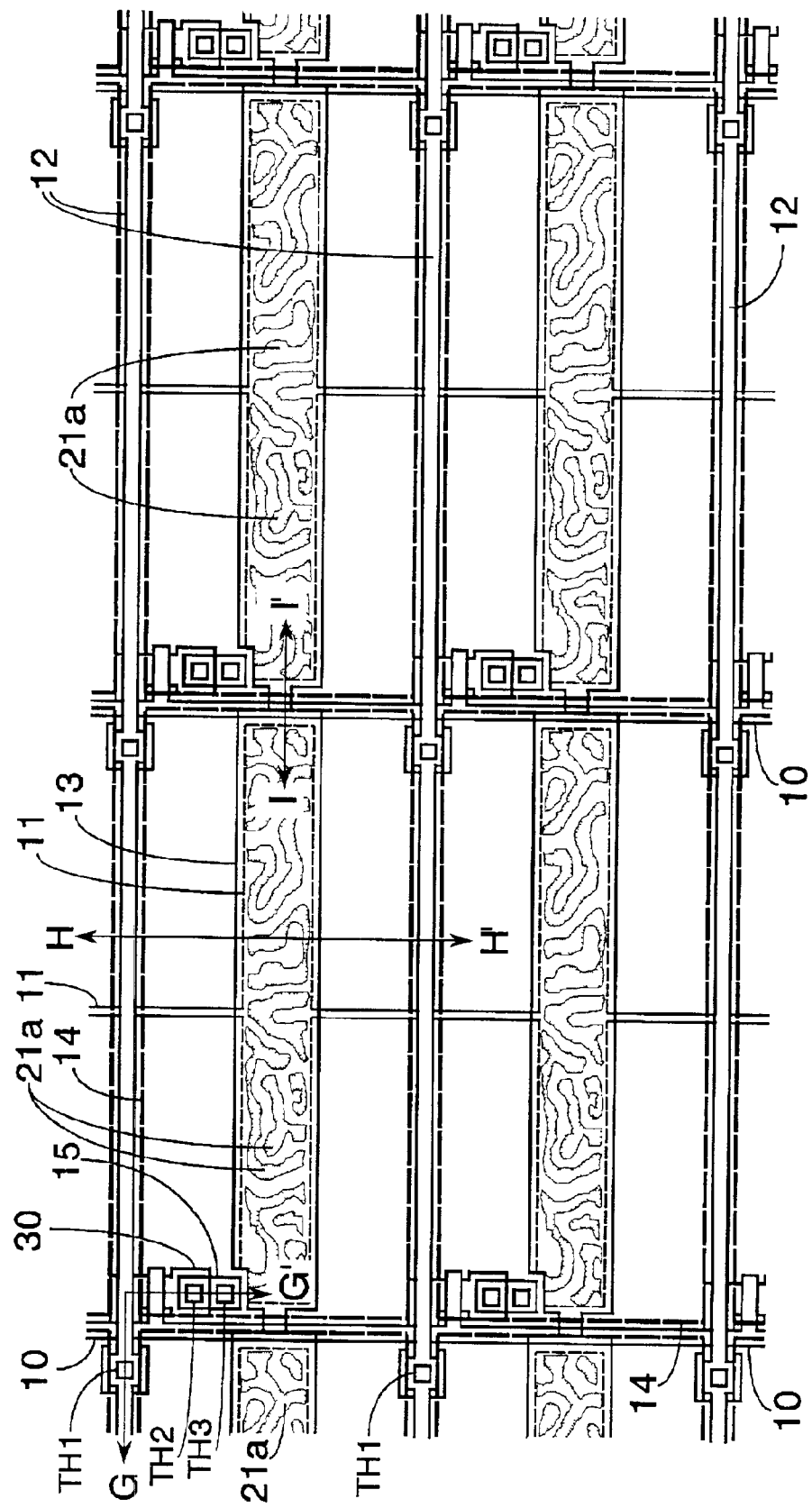
FIG. 5 is a pixel plan view of the liquid crystal display device related to a third embodiment of the present invention.

FIG. 3 and FIGS. 4A to 4C are diagrams showing a plan view and cross-sectional views of a unitary pixel of a liquid crystal display device in accordance with a second embodiment of the present invention. FIGS. 4A to 4C show sectional structures taken along lines D–D', E–E' and F–F' of FIG. 3, respectively. It should be noted that in a similar manner to FIGS. 1 and 2A to 2C, the plan view diagram of FIG. 3 and respective sectional views of FIGS. 4A to 4C only show the so-called TFT substrate of a pair of substrates of the liquid crystal display device with a liquid crystal layer sandwiched therebetween, wherein a polarizer plate or the like which is multilayered on a main surface on the opposite side to the liquid crystal layer in the sectional diagram of the TFT substrate is eliminated from the illustration.

It is formed on an insulating film for use as a buffer layer which is constituted from a $Si_3N_4$ film 200 with a film thickness of 50 nm and a $SiO_2$ film 2 of 120 nm thick over a no-alkali glass substrate 1 with a distortion point of about 670° C.

On the buffer insulating film 21 is formed a polycrystalline Si (referred to hereinafter as "poly-Si") film 30 with a film thickness of 50 nm for constituting TFTs, wherein a scan wiring lead electrode 10 made of Mo with a film thickness of 200 nm is formed over each poly-Si 30 through a 100-nm thick gate insulation film 20 made of $SiO_2$.

An interlayer dielectric film 21 made of 400-nm thick $SiO_2$ is formed to cover all of the above-noted members; via contact through-holes TH1, TH2 as provided in the interlayer dielectric film 21, a signal lead electrode 12 which consists essentially of a three-layered metal films of Mo/Al/Mo (12a/12b/12c and 15a/15b/15c) and a source electrode 15 are connected to source/drain layers being provided at part of the poly-Si layer 30.

A reflection electrode 13 formed of Mo/Al multilayer electrode (13a/13b) is formed so that it is separated from the source electrode 15. These elements are entirely coated by a protective insulating film 22 made of $Si_3N_4$ with a film thickness of 200 nm and an organic protective film 23 mainly comprised of acrylic resin material with a film thickness of 2 μm. Further a pixel electrode 14 made of indium tin oxide (ITO) is connected to the source electrode 15 of a TFT through a contact through-hole TH3 that is provided in the protective insulating film 22 and organic insulating film 23, and is formed to cover almost the entire surface of a pixel region which is surrounded by two signal lead electrodes and two scan lead electrodes.

The reflection electrode 13 is disposed substantially at a central portion lying midway between two neighboring signal electrodes 12 to thereby define a reflective display region as an almost rectangular planar shape being extended in a pixel elongate direction (the extension direction of signal lead electrode 12). A single pixel region in this embodiment has a planar structure which consists essentially of the reflective display region and a transmissive display region that is spaced apart from this reflective display region and is defined as a region residing between two neighboring signal lead electrodes. In addition, the reflection electrode 13 is connected to reflection electrodes 13 of two neighboring pixels in the pixel elongate direction (lateral direction in FIG. 3) with the mutually connected reflection electrodes being used as a charge storage capacitance common electrode, resulting in formation of a charge storage capacitor using this common electrode and the pixel electrode along with the protective insulating film 22 and organic insulating film 23 interposed therebetween.

In accordance with this embodiment, in addition to the effects brought by the first embodiment stated supra, the load capacitance being added to a single common electrode becomes smaller so that any possible waveform distortion of a common electrode voltage is reduced, resulting in an improvement in image quality. This is caused by electrical isolation of the reflection electrode 13 from the pixel electrode 14 while letting this have a potential to be applied to the common electrode(s) 11 of the embodiment 1. Additionally, when compared to the charge storage capacitor of the embodiment 1 in which the conductive layer having a potential of the pixel electrode and the layer having a potential of the common electrode are spaced apart from each other by mere use of the interlayer dielectric film 21, these conductive layer are separated by use of a multilayer structure of the protective insulating film 22 which is thicker than the interlayer dielectric film 21 and the organic insulating film 23; thus, it is possible to rapidly release or discharge the charge stored at the pixel electrode 14 out of the pixel electrode 14 toward the signal lead electrode 12 side in an event of replacement of image information (the possibility that the charge being temporarily stored at the pixel electrode continues to reside after replacement of image information becomes extremely lower).

<Embodiment 3>

Figure 6A:
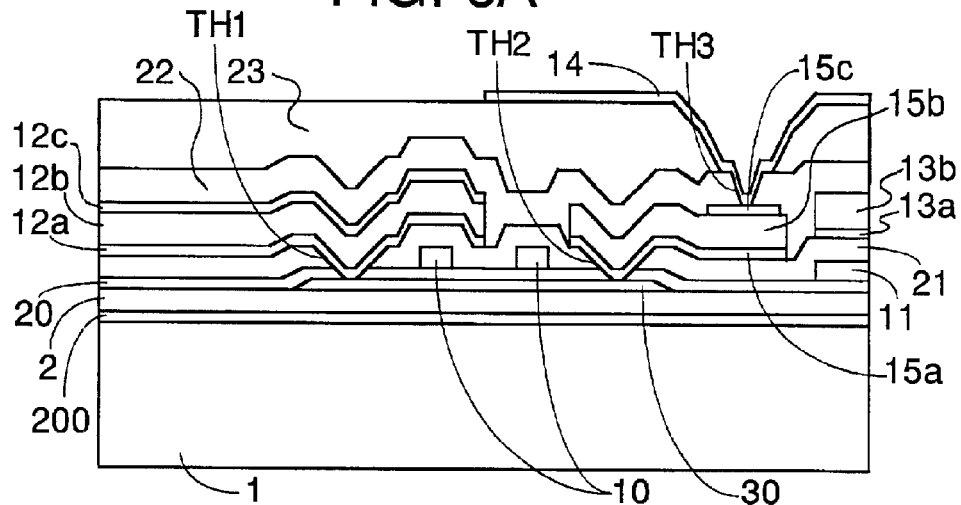
Figure 6B:
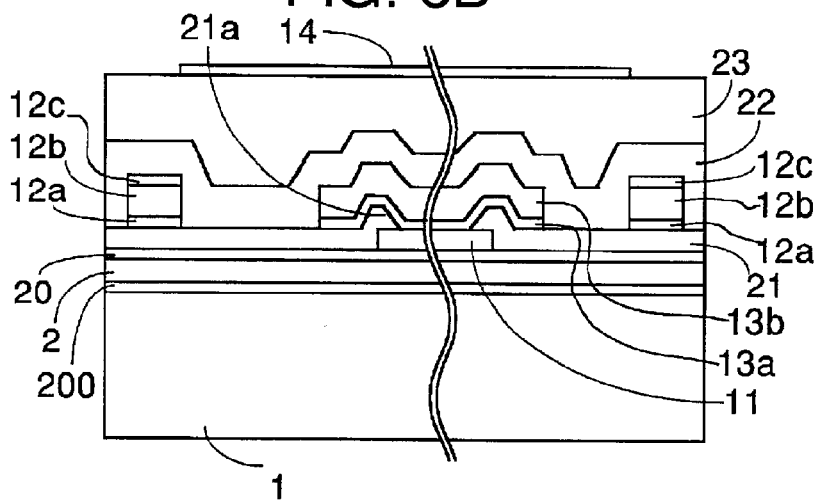
Figure 6C:
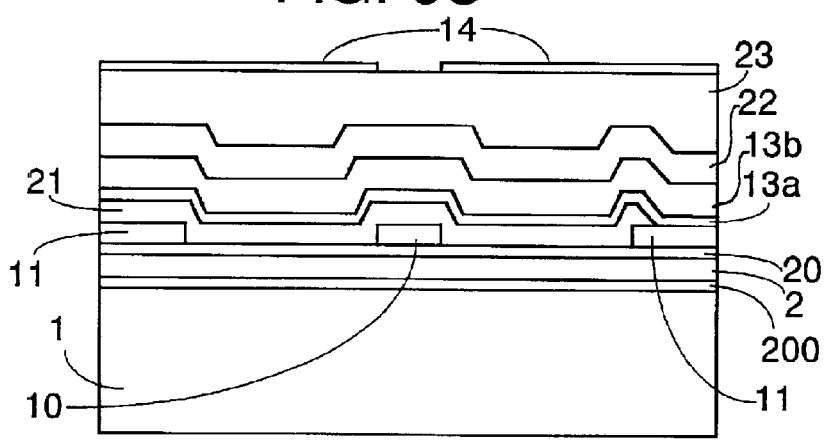

FIG. 5 and FIGS. 6A to 6C are diagrams showing a plan view and cross-sectional views of a unitary pixel of a liquid crystal display device in accordance with a third embodiment of the instant invention. FIGS. 6A to 6C show cross-sections of G–G', H–H' and I–I' portions of FIG. 5, respectively. It should be noted that in a similar manner to FIGS. 1 and 2A to 2C, the plan view diagram of FIG. 5 and respective sectional views of FIG. 6A to 6C only show the so-called TFT substrate of a pair of substrates of the liquid crystal display device with a liquid crystal layer sandwiched therebetween, wherein a polarizer plate or the like to be multilayered on a main surface on the opposite side to the liquid crystal layer in the sectional diagram of the TFT substrate is eliminated from the illustration.

It is formed on an insulating film for use as a buffer layer which is constituted from a $Si_3N_4$ film 200 with a film thickness of 50 nm and a $SiO_2$ film 2 of 120 nm thick over a no-alkali glass substrate 1 with a distortion point of about 670° C.

On the buffer insulating film 21 is formed a polycrystalline Si (referred to hereinafter as "poly-Si") film 30 with a film thickness of 50 nm for constituting TFTs, wherein a scan wiring lead electrode 10 made of Mo with a film thickness of 200 nm is formed over each poly-Si 30 through a 100-nm thick gate insulation film 20 made of $SiO_2$.

In addition, a common electrode 11 of charge storage capacitance is formed using the same Mo as the scan lead electrodes 10.

An interlayer dielectric film 21 made of 400-nm thick $SiO_2$ is formed to cover all of the above-noted members; via more than one contact through-hole as provided in the interlayer dielectric film 21, a signal lead electrode which consists essentially of a three-layered metal films of Mo/Al/Mo (12a/12b/12c and 15a/15b/15c) and a source electrode 15 are connected to source/drain layers that are provided at part of the poly-Si layer 30.

A reflection electrode 13 formed of Mo/Al multilayer electrode (13a/13b) is formed so that it is separated from the source electrode 15. These elements are entirely coated by a protective insulating film 22 made of $Si_3N_4$ with a film thickness of 200 nm and an organic protective film 23 mainly comprised of acrylic resin material with a film thickness of 2 μm. Further a pixel electrode 14 made of indium tin oxide (ITO) is connected to the source electrode 13 of a TFT through a contact through-hole that is provided in the protective insulating film 22 and organic insulating film 23, and is formed to cover almost the entire surface of a pixel region which is surrounded by two signal lead electrodes and two scan lead electrodes.

The reflection electrode 13 is disposed substantially at a central portion midway between two neighboring signal electrodes 12 to thereby define a reflective display region as an almost rectangular planar shape being extended in a pixel elongate direction, resulting in establishment of a planar arrangement including the reflective display region and a region between two signal lead electrodes adjacent thereto which is defined as a transmissive display region. Additionally the reflection electrode 13 is connected to reflection electrodes 13 of two neighboring pixels in the pixel elongate direction with the mutually connected reflection electrodes being used as a charge storage capacitance common electrode, resulting in formation of a charge storage capacitor using this common electrode and the pixel electrode along with the protective insulating film 22 and organic insulating film 22 as interposed therebetween.

Figure 7:
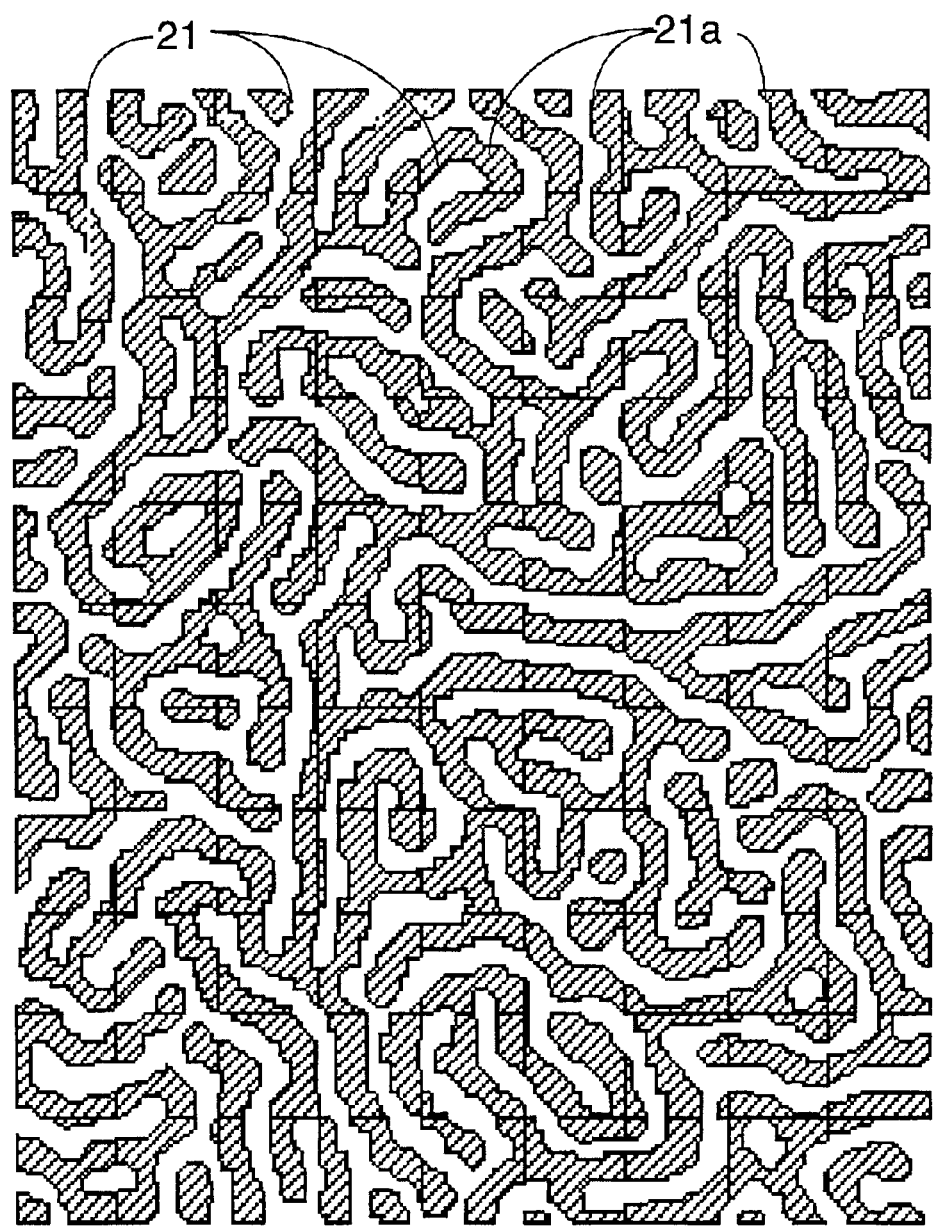
FIG. 7 is a plan view illustrating a planar structure for light diffusion (recess-like pattern) used in the third embodiment of the present invention.

Additionally this embodiment is featured in that a recess-like pattern 21a having a predefined shape is formed in the interlayer dielectric film 21 underlying the reflective electrode 13 while letting a convexo-concave configuration be formed in a surface of reflective electrode 13 in accordance with this pattern to thereby cause it to have light diffuseability. FIG. 7 shows an example in which the recess-like pattern 21a as formed at interlayer dielectric film 21 was formed. FIG. 7 shows a plan view of the interlayer dielectric film 21, wherein portions with hatching added thereto in this image indicate regions 21a which are processed into recess-like shape. A real pattern on pixels is the one that utilizes part of the pattern of FIG. 7.

Figure 8:
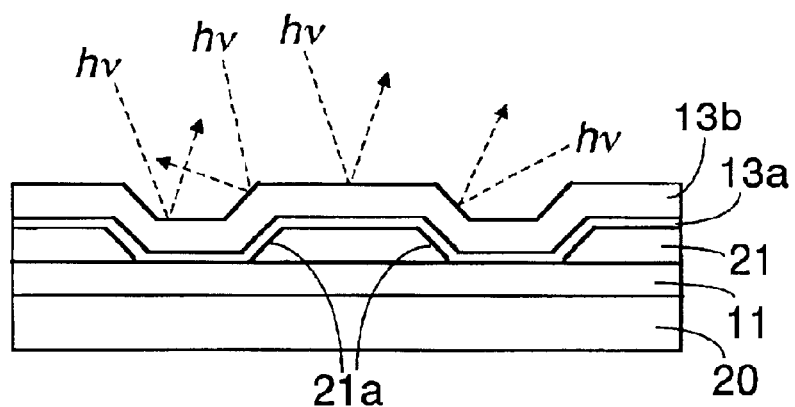
FIG. 8 is a cross-section explaining a cross-sectional shape of the pattern for the light diffusion used in the third embodiment of the present invention and a function thereof.

FIG. 8 shows a sectional view of this recess-like processed pattern. The interlayer dielectric film 21 made of $SiO_2$ is processed or "machined" by wet etching methods into a cross-sectional shape with a taper angle of about 45°, with the reflective electrode 13 being formed thereon. A common electrode 11 is disposed under the interlayer dielectric film 21 for playing a role as an etch stopper of the $SiO_2$ film. Tapered surfaces at pattern edge portions contribute to optical diffusion. Accordingly, in order to obtain sufficient optical diffuseability, it is required to sufficiently lengthen the length of an edge portion (contour) of the pattern.

Figure 9:
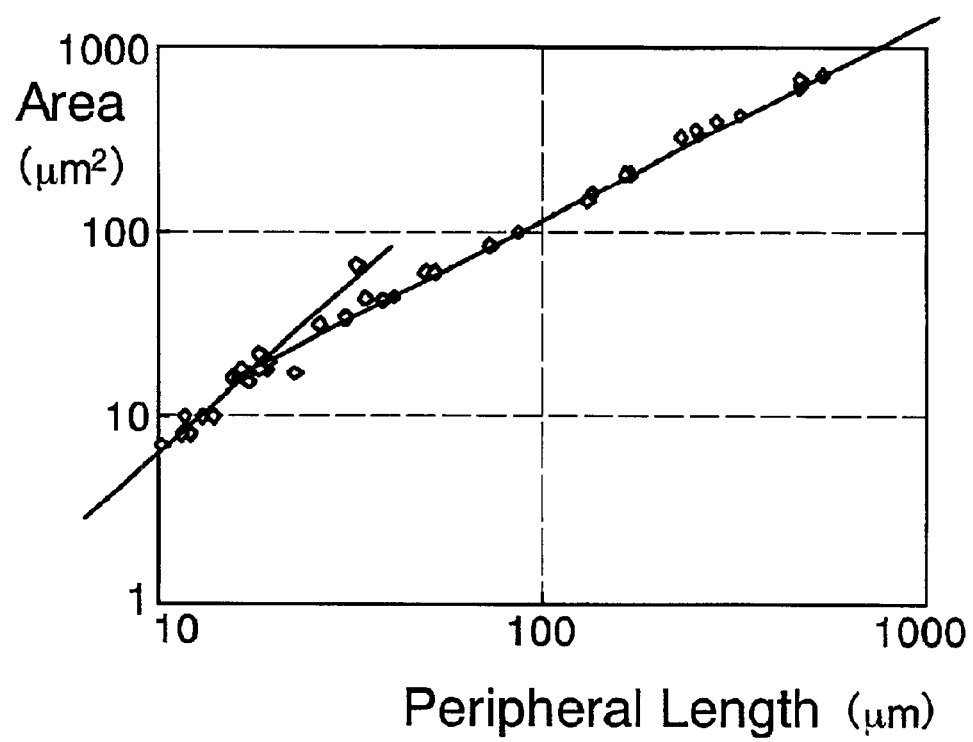
FIG. 9 is a drawing (graphic chart) showing a relationship between a peripheral length of the pattern for the light diffusion used in the third embodiment of the present invention and a pattern area thereof.

FIG. 9 shows a relationship of a peripheral length of the recess-like pattern shown in FIG. 7 versus a pattern area. In order to increase the length of a pattern edge portion, it is required to let it have an intricate and complicated pattern which is represented also as "J" type, "U" type, "W" type, or "Y" type, rather than circular or square shapes. Such intricate contours will not necessarily be applied to all the recess-like patterns: similar optical diffusion effects may be expected even in cases where part of the recess-like pattern has such type of complicated contours. Practically the pattern shape is determinable in such a way that the pattern's peripheral length L and the pattern area S satisfy the above-presented relationship of Equation 5 (i.e., $1.0 \leq A < 2.0$) in the relation of Equation 4 (log S=A×log L+B) stated supra.

In the example of FIG. 9, the value of "A" measures 1.1 within a region in which L is greater than about 20 μm and measures about 1.9 in a region with L being less than about 20 μm. When L gets smaller, the pattern shape becomes closer to simple shapes such as circles or squares; thus, "A" is coming closer to 2. In other words, it is apparent from viewing FIG. 9 that a pattern which satisfies the relations of Equations 4 and Equation 5 is such that an increase in pattern occupation area stays relatively less even when its peripheral length becomes longer. Hence, by forming in the interlayer dielectric film 21 a pattern of recess portions or openings in the way as has been stated in this embodiment and then forming thereon a thin film made of a metal or its alloys for later use as either the reflection electrode or optical reflective layer, it becomes possible to enlarge the packing density (density of a reflective plane as given by recesses) of the recess-like pattern at this reflection electrode or the optical reflective layer, which in turn enables addition of the required optical diffuseability with increased efficiency. It must be noted that although in this embodiment the recess-like pattern is formed at an upper surface of the interlayer dielectric film 21 on which the reflection electrode 13 is to be formed, this may be replaced by a recess-like pattern that is formed at another dielectric film placed on the lower side of the interlayer dielectric film 21 or alternatively at the reflection electrode 13 per se (for example, the first conductive layer made of Mo in this embodiment). Also note that although the explanation using FIG. 8 is specifically directed to the formation of slant faces (tapers) of 45° on the upper surface of the reflective electrode 13 owing to the edges of recess portions 21a of the interlayer dielectric film 21, the invention should not be limited only to the significance of the angle of such slant faces; for example, even in cases where a recess portion that was appeared at the upper surface of the reflection electrode 13 has its side wall crossing the substrate main surface at substantially right angles thereto, this embodiment's intended diffusion of incident light (indicated by "hv" in FIG. 8) may be realized although there is a little degree of differences.

Additionally in this embodiment, the reflection electrode 13 and the common electrode 11 are connected together while at the same time letting the reflection electrode 13 be connected to reflection electrodes 13 of two neighboring pixels in the pixel elongate direction to thereby enable electrical power to be supplied from both directions of a direction in parallel to scan lead electrodes and a vertical direction. Due to this, a distortion of the waveform of a common electrode voltage is suppressed, thus improving the resultant image quality.

<Embodiment 4>

Figure 11A:
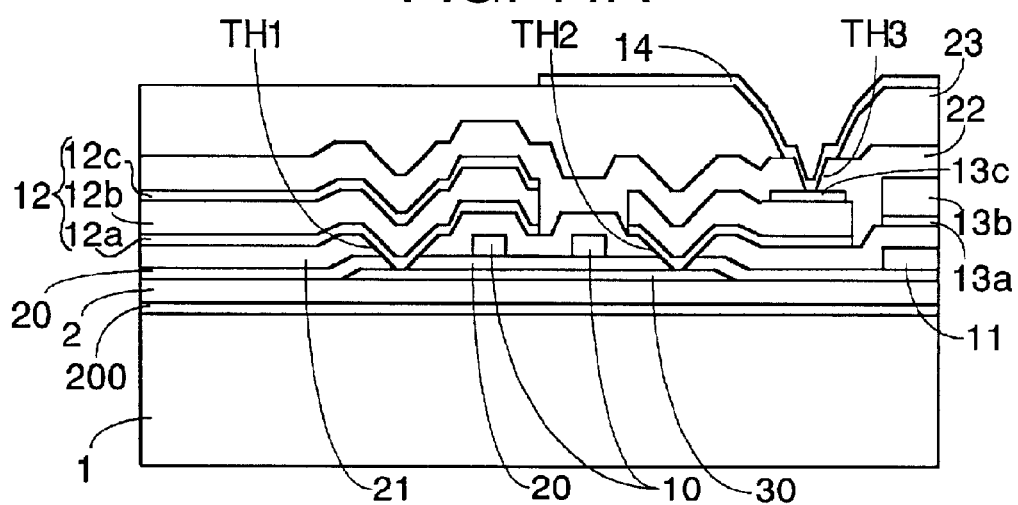
Figure 11B:
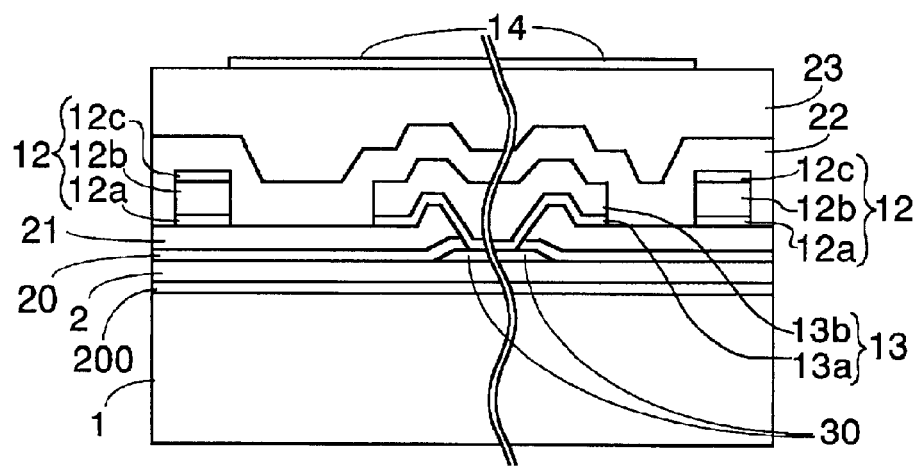
Figure 11C:
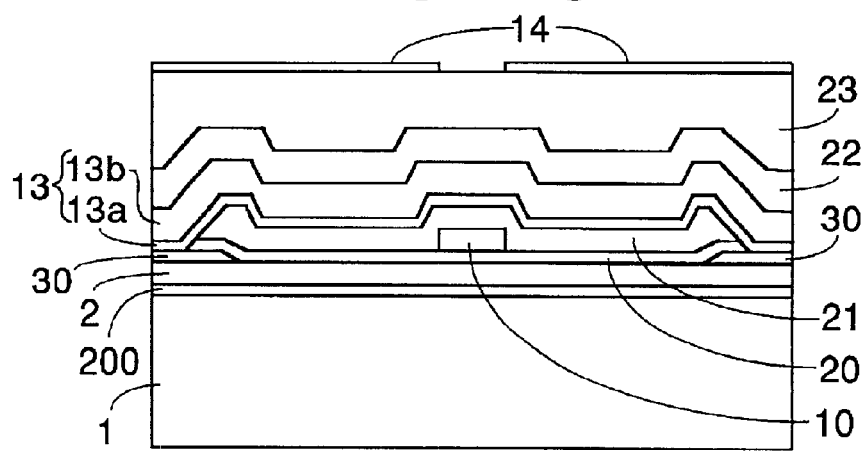

FIG. 10 and FIGS. 11A to 11C are diagrams showing a plan view and sectional views of a unitary pixel of a liquid crystal display device in accordance with a fourth embodiment of the present invention. FIGS. 11A to 11C show cross-sections of J–J', K–K' and L–L' portions of FIG. 10, respectively. It should be noted that in a similar manner to FIGS. 1 and 2A to 2C, the plan view diagram of FIG. 10 and respective sectional views of FIGS. 11A to 11C only show the so-called TFT substrate of a pair of substrates of the liquid crystal display device with a liquid crystal layer sandwiched therebetween, wherein a polarizer plate or the like to be multilayered on a main surface on the opposite side to the liquid crystal layer in the sectional diagram of the TFT substrate is eliminated from the illustration.

Although the fourth embodiment is substantially the same as the aforesaid third embodiment, the former is different from the latter in that a semiconductor later 30 making up a TFT rather than a common electrode 11 is disposed at a lower layer of reflective electrode 13.

The reflection electrode 13 is connected to reflection electrodes 13 of two adjacent pixels in the pixel elongate direction and is used as a charge storage capacitance common electrode, resulting in a charge storage capacitor being made up of the reflection electrode 13 and pixel electrode 14 along with a protective insulating film 22 and organic insulating film 23 as interposed between these electrodes.

With this embodiment, the common electrode 11 that was disposed in parallel to the scan lead electrodes 10 in the third embodiment is excluded thereby enabling improvement of aperture ratios at transmissive portions. Additionally, replacing the common electrode 11 by the semiconductor layer 30 (its contour is indicated by broken lines in FIG. 10) at part underlying the reflection electrode 13 makes it possible to allow slantwise incident light through a lower side of the reflection electrode 13 from the substrate 1 to radiate outwardly while letting it diffuse toward lateral directions, which in turn makes it possible to permit incoming radiation of an increased amount of light from a backlight unit to the liquid crystal layer.

<Embodiment 5>

Figure 13A:
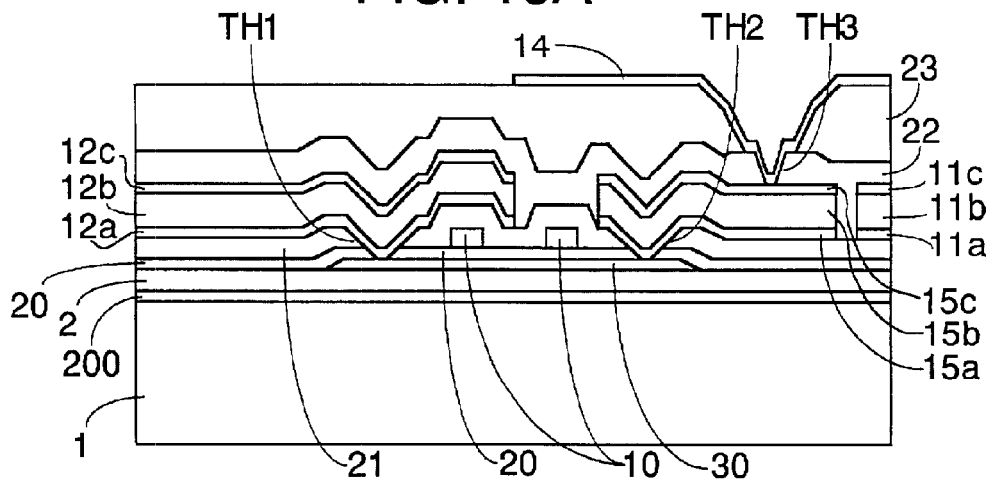
Figure 13B:
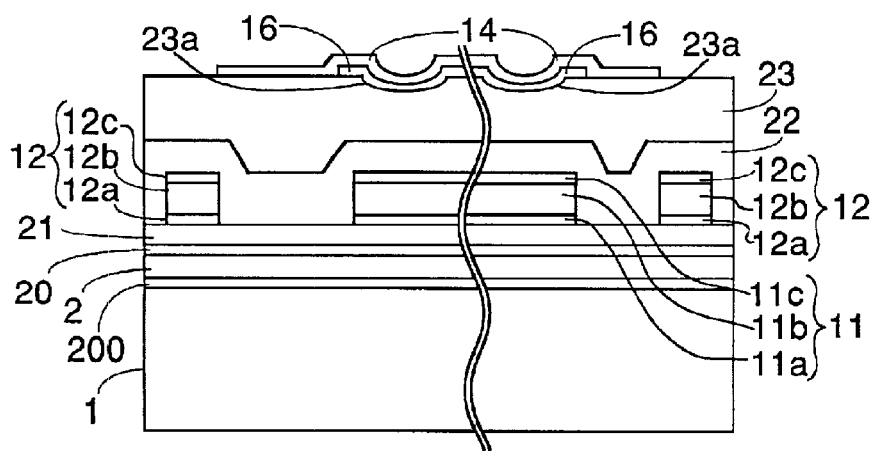
Figure 13C:
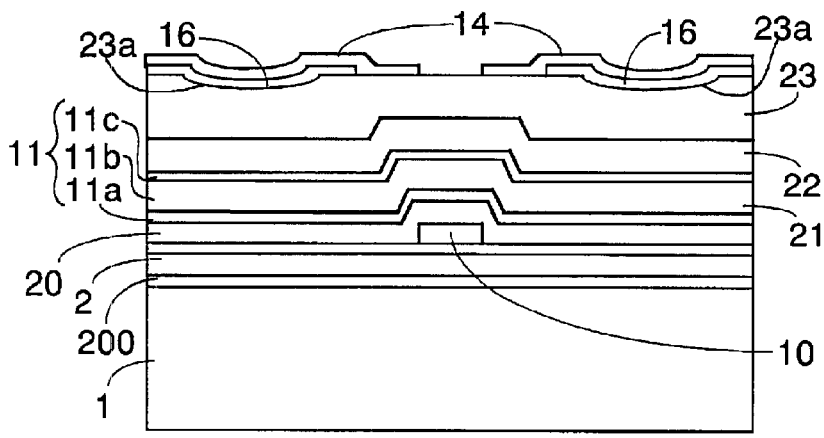

FIG. 12 and FIGS. 13A to 13C are diagrams showing a plan view and sectional views of a unitary pixel of a liquid crystal display device in accordance with a fourth embodiment of this invention. FIGS. 13A to 13C show cross-sectional views of M–M', N–N' and O–O' portions of FIG. 12, respectively. Note here that in a similar manner to FIGS. 1 and 2A to 2C, the plan view diagram of FIG. 12 and respective sectional views of FIGS. 13A to 13C only show the so-called TFT substrate of a pair of substrates of the liquid crystal display device with a liquid crystal layer sandwiched therebetween, wherein a polarizer plate or the like to be multilayered on a main surface on the opposite side to the liquid crystal layer in the sectional diagram of the TFT substrate is eliminated from the illustration.

It is formed on an insulating film for use as a buffer layer which is constituted from a $Si_3N_4$ film 200 with a film thickness of 50 nm and a $SiO_2$ film 2 of 120 nm thick over a no-alkali glass substrate 1 with a distortion point of about 670° C.

On the buffer insulating film 21 is formed a polycrystalline Si (referred to hereinafter as "poly-Si") film 30 with a film thickness of 50 nm for constituting TFTs, wherein a scan wiring lead electrode 10 made of Mo with a film thickness of 200 nm is formed over each poly-Si 30 through a 100-nm thick gate insulation film 20 made of $SiO_2$.

An interlayer dielectric film 21 made of 400-nm thick $SiO_2$ is formed to cover all of the above-noted members; via contact through-holes TH1, TH2 as provided in the interlayer dielectric film 21, a signal lead electrode 12 which consists essentially of a three-layered metal films of Mo/Al/Mo (12a/12b/12c and 15a/15b/15c) and a source electrode 15 are connected to source/drain layers being provided at part of the poly-Si layer 30.

A common electrode 11 formed of Mo/Al/Mo multilayer electrode (11a/11b/11c) is formed so that it is separated from the source electrode 15. These elements are entirely coated by a protective insulating film 22 made of $Si_3N_4$ with a film thickness of 200 nm and an organic protective film 23 mainly comprised of acrylic resin material with a film thickness of 2 μm. Further a pixel electrode 14 made of indium tin oxide (ITO) is connected to the source electrode 13 of a TFT through more than one contact through-hole as provided in the protective insulating film 22 and organic insulating film 23, and is formed to cover almost the entire surface of a pixel region which is surrounded by two signal lead electrodes and two scan lead electrodes.

A reflective electrode 16 made of Al—Nd alloy is disposed at a lower layer of the pixel electrode in such a manner as to almost cover the common electrode 11; an organic insulating film 23 underlying the reflective electrode 16 is processed into a recess-like shape, causing the reflective electrode to have light diffuseability (see a recess-like portion 23a formed on the upper surface of the organic insulating film). A planar shape with the recess-machined pattern is designed to resemble the shape shown in FIG. 7. It is possible to efficiently add the light diffuseability required.

<Embodiment 6>

Figure 14:
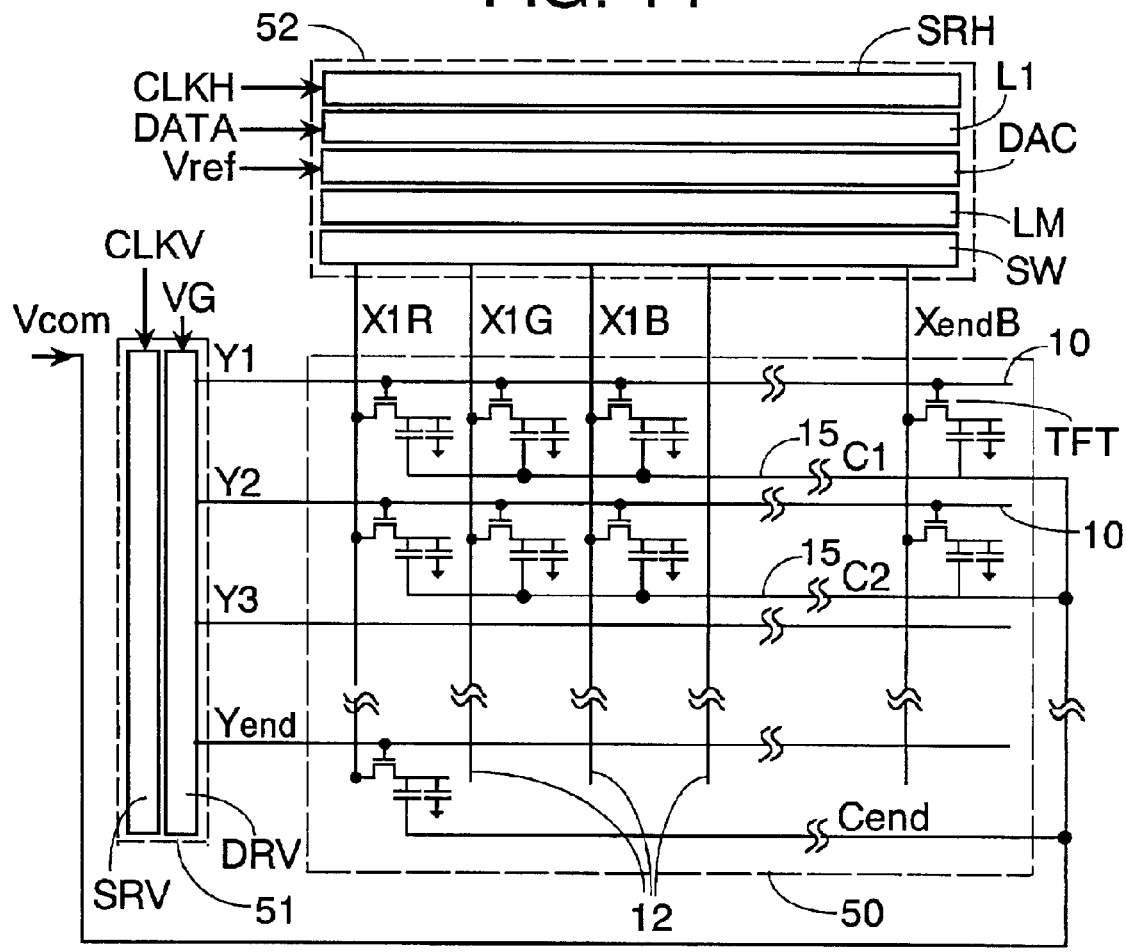
FIG. 14 is a diagram showing a structure of a built-in driver circuit-type liquid crystal display device related to a sixth embodiment of the present invention.

FIG. 14 shows an equivalent circuit of an overall liquid crystal display device with peripheral circuitry and a TFT active matrix integrated together on the same substrate. For example, it is constituted from a TFT active matrix array 50 including pixels similar in structure to those shown in FIGS. 1 and 2, scan lead electrodes 10 of Y1 to Yend and first signal lead electrodes 12 of X1R, X1G and X1B–XendB and second signal lead electrodes 15 of C1–Cend, a vertical scanning circuit 51 for driving this, a first signal side drive circuit (horizontal scan circuit) 52, and a second signal side drive circuit (not shown) for supplying a signal Vcom to a second signal lead electrode(s). In this embodiment, 600 scan wiring lines and 2,400 signal transfer lines are provided, with the diagonal size of a display section being set at approximately 5 inches.

The vertical scan circuit 51 consists essentially of a shift register circuit SRV which is driven by a vertical clock signal and a level shifter DRV to which a row select signal is supplied, for output of a row select pulse or pulses to a scan lead electrode(s) 10.

The horizontal scan circuit 52 is configured from a shift register circuit SRH as driven by a horizontal clock signal, a latch circuit L1 for latching 6-bit digitized image data DATA, a digital to analog converter circuit DAC for decoding the latched digital data into analog data, a line memory LM for temporal storage of an output from a DAC portion corresponding to one line, and an analog switch SW for supplying image data being stored at the line memory to a signal lead electrode(s) 12. Note that a reference voltage signal Vref that is weighted in a way corresponding to each bit is being supplied to the DAC.

These drive circuits are formed of either poly-Si TFTs of the complementary metal oxide semiconductor (CMOS) type (thin-film transistors having a channel made of poly-crystalline silicon) or N-type poly-Si TFTs.

As the drive circuits including digital-to-analog converters have been integrated on the substrate using Poly-Si TFTs, it was possible to significantly reduce in number external connection terminals and external components. In addition, the use of the pixels of the present invention made it possible to improve light utilization efficiency thereby enabling reduction of electrical power consumption of a LCD module as a whole.

<Embodiment 7>

Figure 15:
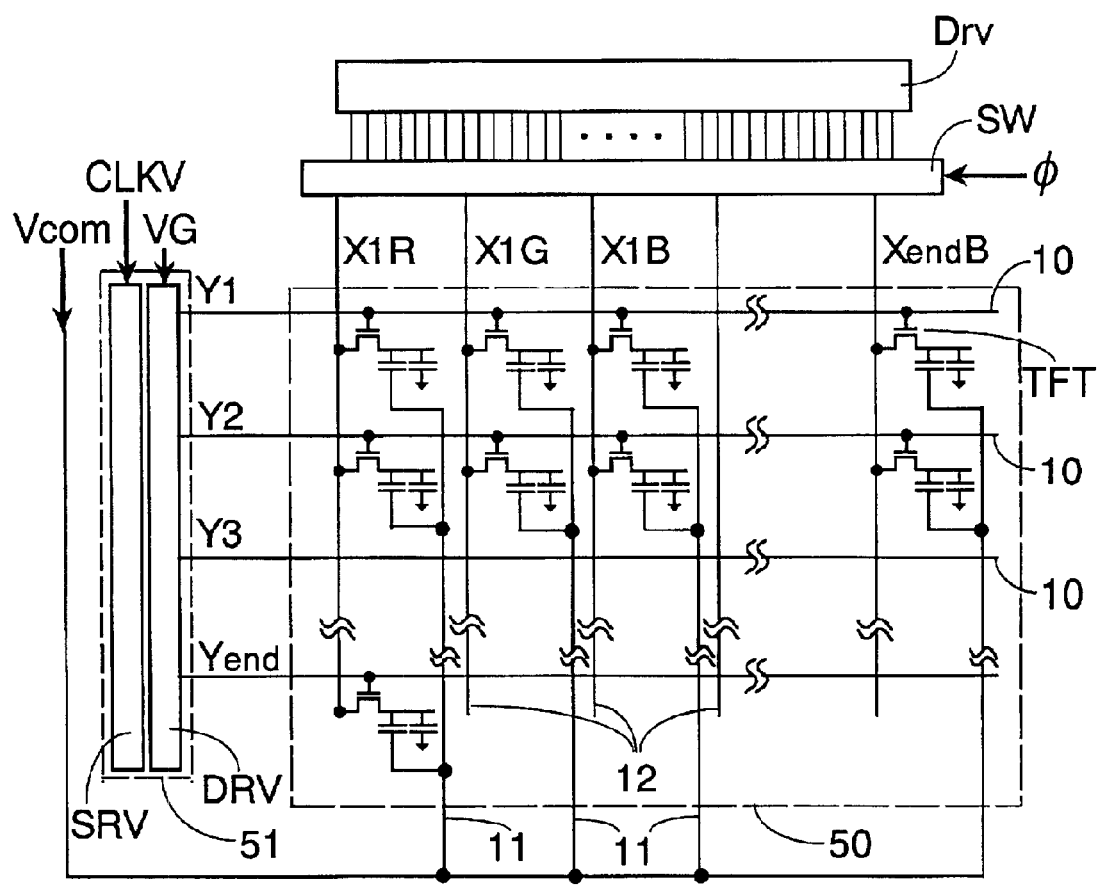
FIG. 15 is a diagram showing a structure of a built-in driver circuit-type liquid crystal display device related to a seventh embodiment of the present invention.

FIG. 15 shows an equivalent circuit of an overall liquid crystal display device with part of peripheral circuitry and a TFT active matrix integrated together on the same substrate. For example, it is constituted from a TFT active matrix array 50 including pixels similar in structure to those shown in FIGS. 3 and 4A to 4C, scan lead electrodes 10 of Y1 to Yend and first signal lead electrodes 12 of X1R, X1G and X1B–XendB and second signal lead electrodes 15 of C1–Cend, a vertical scan circuit 51 for driving this, a horizontal side large-scale integrated (LSI) driver circuit DRV, and a switch circuit SW for distribution of an output of the driver LSI to a plurality of first signal lead electrodes. In this embodiment, 176 scan lines and 432 signal lines are employed, with the diagonal size of a display section measuring about 2 inches. Additionally in this embodiment, the poly-Si TFT-based drive circuits are all arranged using N-type TFTs only.

Figure 16:
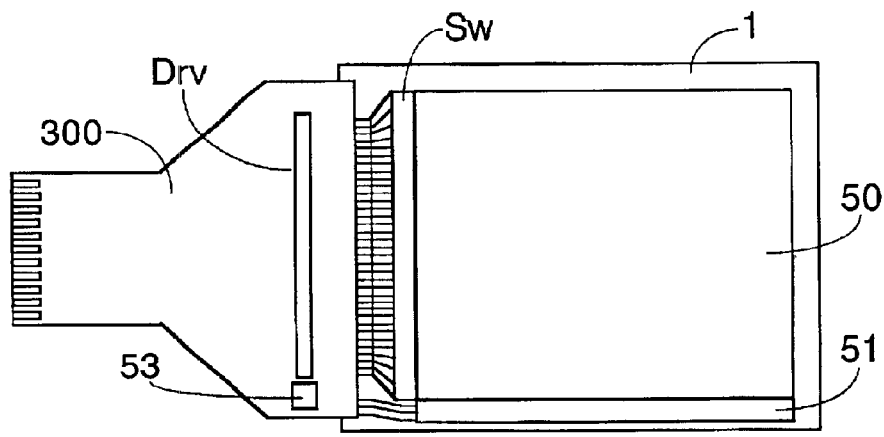
FIG. 16 is an overall plan view of a built-in driver circuit-type liquid crystal display device (liquid crystal display module) related to a seventh embodiment of the present invention.

FIG. 16 is a plan-view diagram showing an outer appearance of a liquid crystal display device in accordance with this embodiment.

There are formed on a glass substrate 1 the TFT active matrix 50 and vertical scan circuit 51 plus switch circuit SW, to which a flexible printed circuit (FPC) 300 board with a horizontal side driver LSI Drv and a power supply integrated circuit (IC) 53 being surface-mounted thereon is connected.

Figure 17:
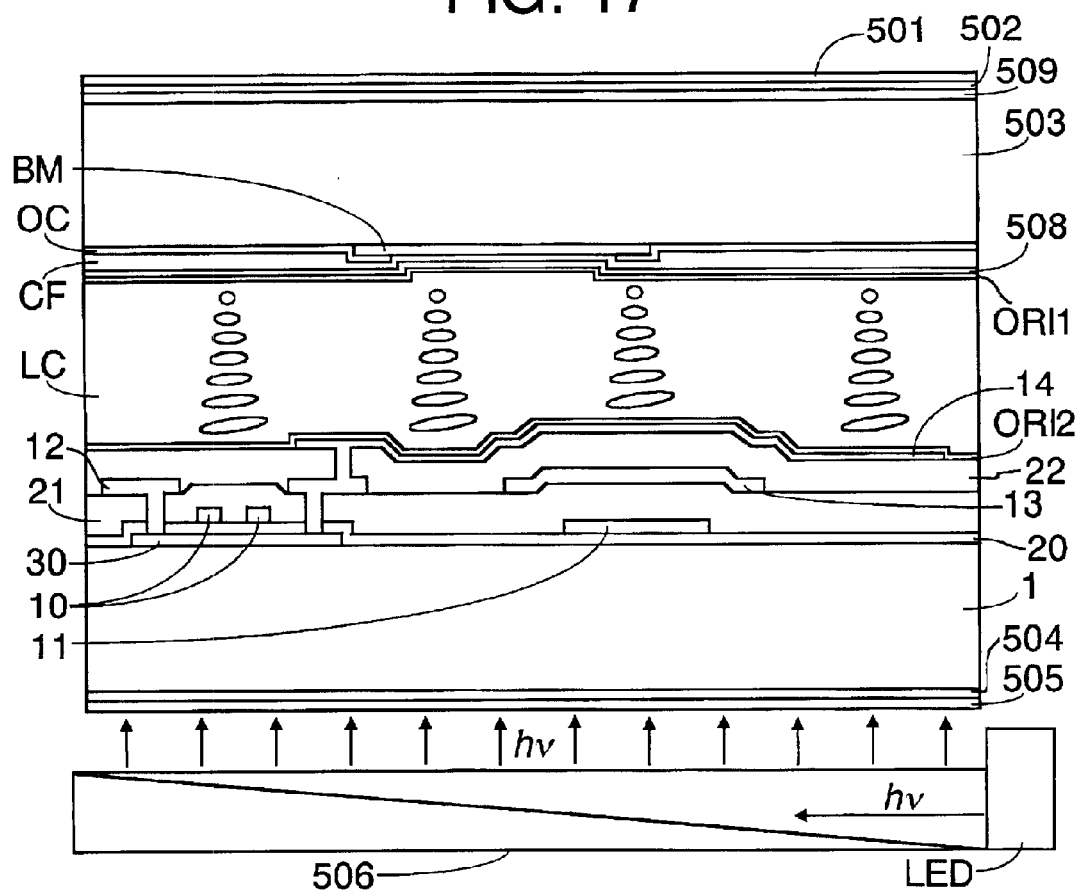
FIG. 17 is a diagram showing a cell cross-section of the liquid crystal display device related to the seventh embodiment of the present invention.

FIG. 17 is a diagram showing a pictorial representation of a liquid crystal cell cross-section of a liquid crystal display device in accordance with this embodiment. Scan lead electrodes and signal lead electrodes 12 are formed into a matrix form on a lower glass substrate 1 with a liquid crystal layer 506 as a reference, for driving pixel electrodes 14 via TFTs as formed adjacent to the cross points thereof, wherein the pixel electrodes are made of ITO. On a glass substrate 503 opposing the substrate with a liquid crystal layer LC sandwiched therebetween are formed a color filter CF, a color filter protective film OC and a counter electrode(s) 508. Optical polarizer plates 501, 505 are formed on outside surfaces of the pair of glass substrates 1, 503, respectively. The liquid crystal layer LC is sealed between upper and lower orientation or alignment films ORI1, ORI2 for setup of directions of liquid crystal molecules and is sealed by sealing material SL (not shown). This liquid crystal display device is assembled by a process including the steps of separately fabricating layers on the glass substrate 1 side and on the opposite glass substrate 503 side, and thereafter overlapping the upper and lower glass substrates 1, 503, and then sealing liquid crystal LC between the both. A TFT-driven color liquid crystal display device is arranged by adjustment of pass-through or transmission of light (hv) coming from a backlight unit 506 by pixel electrodes 14.

Figure 18:
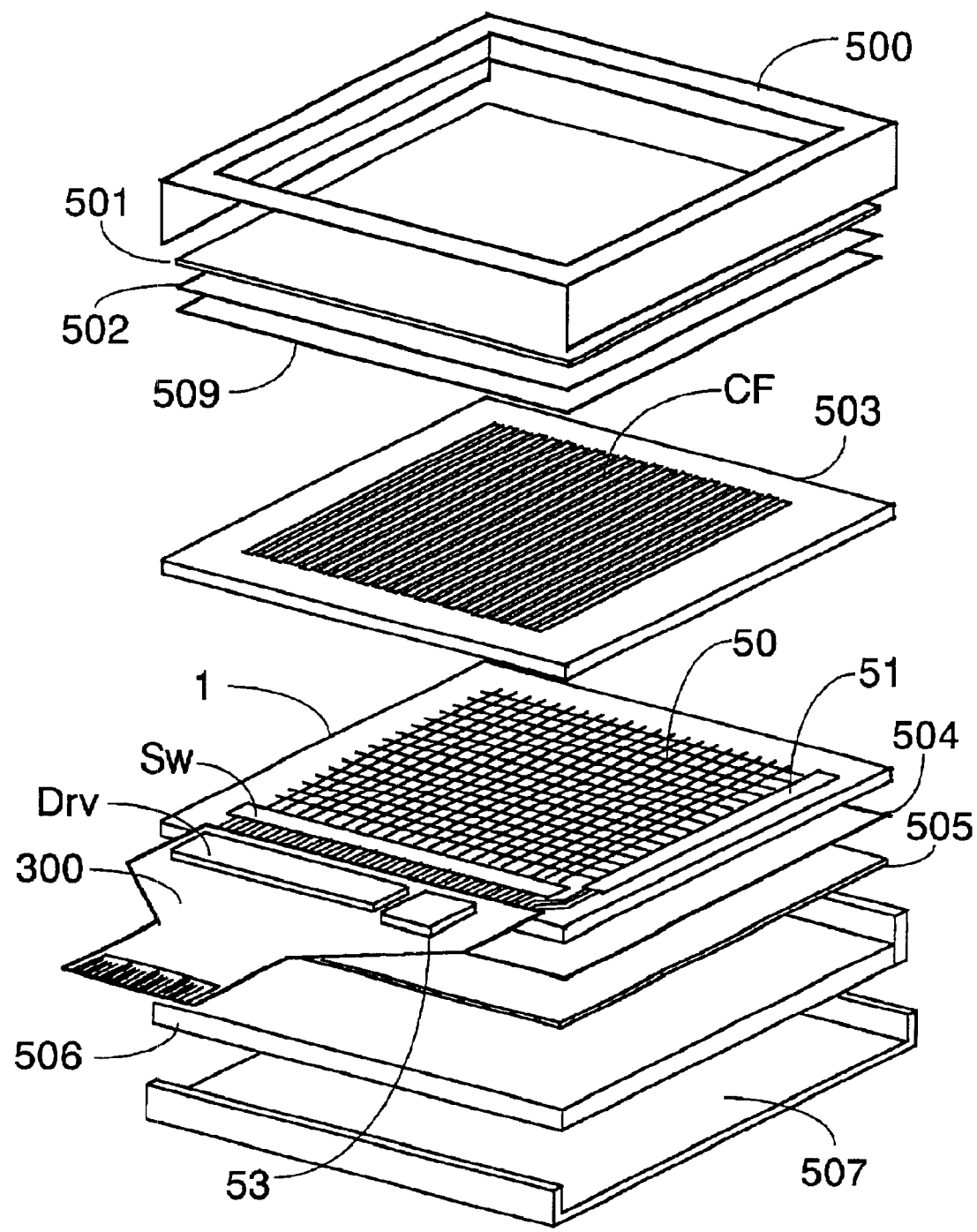
FIG. 18 is an overall squint view of the built-in driver circuit-type liquid crystal display device related to the seventh embodiment of the present invention.
Figure 19:
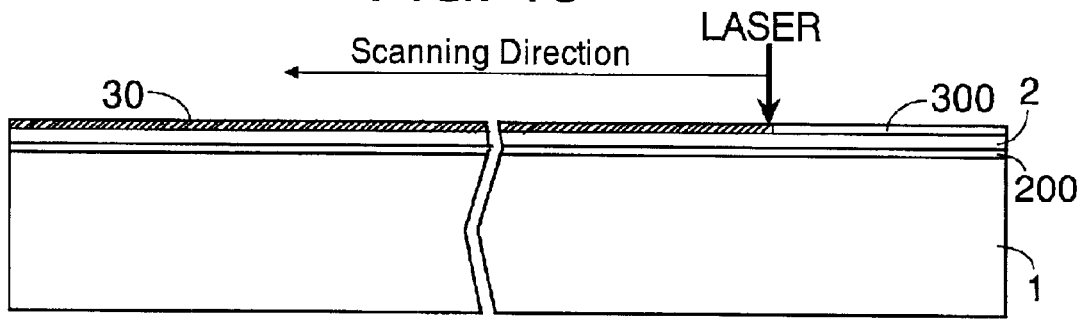
FIG. 19 is a cross-section of the built-in NMOS driver circuit-type liquid crystal display device related to the seventh embodiment of the present invention in a step 1.
Figure 20:
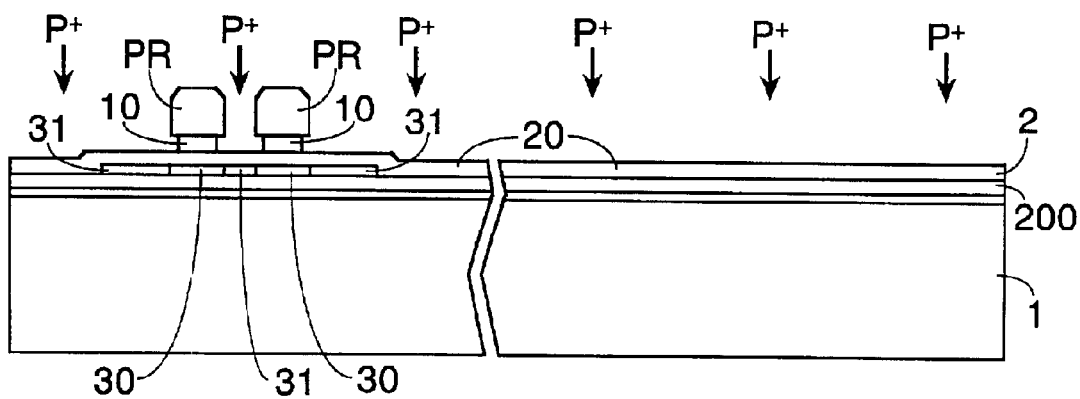
FIG. 20 is a cross-section of the built-in NMOS driver circuit-type liquid crystal display device related to the seventh embodiment of the present invention in a step 2.
Figure 21:
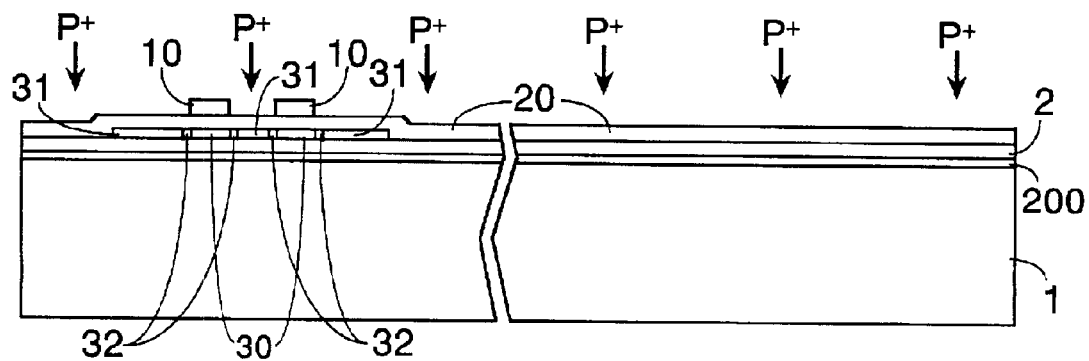
FIG. 21 is a cross-section of the built-in NMOS driver circuit-type liquid crystal display device related to the seventh embodiment of the present invention in a step 3.
Figure 22:
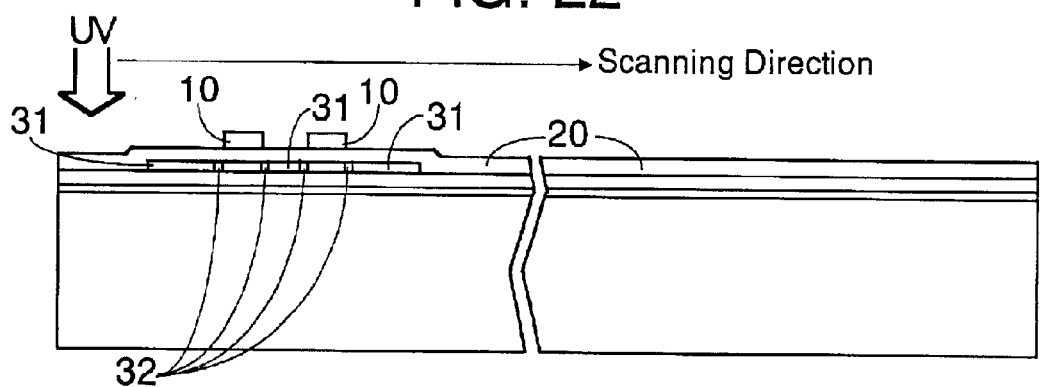
FIG. 22 is a cross-section of the built-in NMOS driver circuit-type liquid crystal display device related to the seventh embodiment of the present invention in a step 4.
Figure 23:
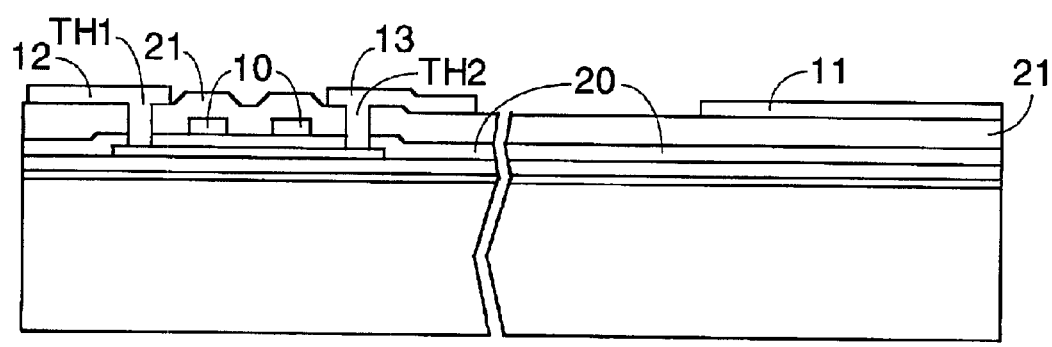
FIG. 23 is a cross-section of the built-in NMOS driver circuit-type liquid crystal display device related to the seventh embodiment of the present invention in a step 5.
Figure 24:
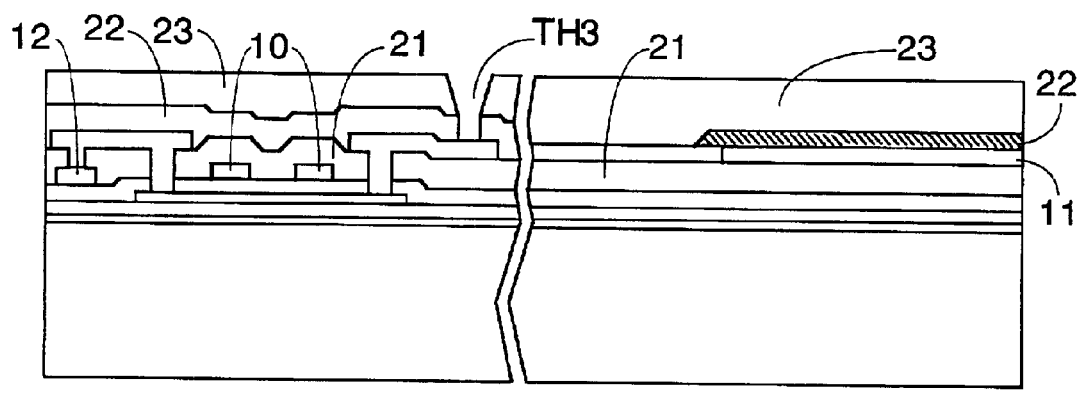
FIG. 24 is a cross-section of the built-in NMOS driver circuit-type liquid crystal display device related to the seventh embodiment of the present invention in a step 6.
Figure 25:
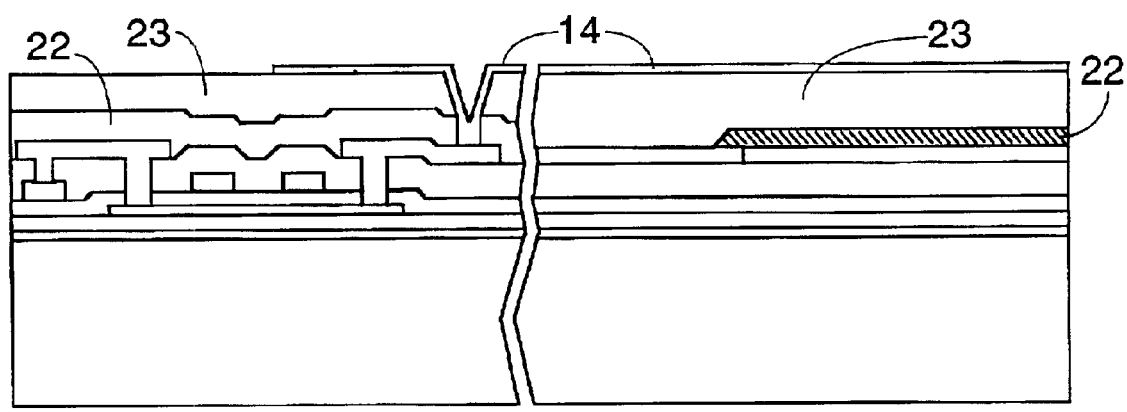
FIG. 25 is a cross-section of the built-in NMOS driver circuit-type liquid crystal display device related to the seventh embodiment of the present invention in a step 7.

FIG. 18 is a diagram showing an overall structure of this liquid crystal display element. The glass substrate 1 with the TFT active matrix and peripheral drive circuitry or the like formed thereon and the counter substrate 503 having its inner surface on which the color filter CF is formed are adhered together with a liquid crystal composition sealed therebetween and with polarization films 505, 501 disposed on respective outer surfaces of the glass substrate 1 and counter substrate 503. Connected to the glass substrate 1 is a flexible printed circuit (FPC) board with a horizontal-side driver LSI Drv and power supply IC 53 mounted thereon.

Further, a phase difference film 504 is disposed between the lower side polarizer film 505 and the glass substrate with a diffusion adhesive layer 502 and a phase difference film 509 laid out between the upper side polarizer film and the counter substrate, thereby making up a partial transmissive/reflective display device. Disposed at lower part of the lower side polarizer film is a backlight unit 506 (see FIG. 17) employing more than one light-emitting diode (LED), all of the above components being supported by a case (upper side frame) 500 and a case (lower side case) 507.

The liquid crystal display device thus arranged is adaptable for use as an image display apparatus in portable wireless telephone handsets and mobile terminals.

<Embodiment 8>

An explanation will next be given of a fabrication process of one exemplary TFT active matrix substrate for use as a liquid crystal display element designed using the N-type TFTs only such as shown in FIG. 15, with reference to FIGS. 19 through 25 below.

<<Process Step 1 (See FIG. 19)>>

After having cleaned the surface of a no-alkali glass substrate 1 having a distortion point of about 670° C. with a thickness of 500 $\mu$m, a width of 750 mm and a width of 950 mm, a plasma CVD method using a mixture gas of $SiH_4$ and $NH_3$ plus $N_2$ is used to fabricate a $Si_3N_4$ film 200 to a film thickness of 50 nm. Subsequently a plasma CVD method using a mixture gas of tetraethoxysilane and $O_2$ is used to form a $SiO_2$ film 2 with a film thickness of 120 nm. Both $Si_3N_4$ and $SiO_2$ are fabricated at a temperature of 400° C.

Next, form a hydrogenated amorphous silicon film 30 on the $SiO_2$ film 2 by plasma CVD methods using a mixture gas of $SiH_4$ and Ar to a thickness of 50 nm. A film fabrication temperature was set at 400° C., and a hydrogen amount immediately after film fabrication was about 5 at %. Next, anneal the substrate at 450° C. for about 30 minutes, thereby causing outward release of hydrogen residing within the hydrogenated amorphous silicon film 300. A hydrogen amount after the annealing was at about 1 at %.

Next, irradiate 308-nm wavelength excimer laser light LASER onto the amorphous silicon film at a fluence (light beam density) of 400 mJ/cm² to cause the amorphous silicon film to become melt-recrystallized, thereby obtaining an almost intrinsic polycrystalline silicon film 30. At this time the laser beam is of a fine line shape with a width of 0.3 mm and a length of 200 mm, wherein it was irradiated while letting the substrate move with a pitch of 10 μm in a direction substantially at right angles to the extension direction of the beam. The laser radiation was done in a nitrogen atmosphere.

Thereafter, standard photolithography methods are used to form a prespecified resist pattern on the polycrystalline silicon (poly-Si) film 30 and then process or "machine" the polycrystalline silicon film 30 into a predetermined shape by reactive etching methods using a mixture gas of $CF_4$ and $O_2$.

<<Step 2 (See FIG. 20)>>

Next, form on the poly-Si film 30 a $SiO_2$ film with a thickness of 100 nm by plasma CVD methods using a mixture gas of tetraethoxysilane and oxygen, thus obtaining a gate insulation film 20. A mixture ratio of tetraethoxysilane and $O_2$ at this time is set at 1:50 with a fabrication temperature of 400° C.

Next, after having formed a 200-nm thick Mo film by sputtering methods, form on the Mo film a predetermined resist pattern by standard photolithography methods, which will then be patterned by wet etch methods using mixed acid into a specified shape, thus obtaining scan lead electrodes 10.

While leaving the resist pattern used during etching, let P ions ($P^+$) be injected or doped by ion implantation methods into the poly-Si film 30 at an acceleration voltage of 60 KeV with a dose amount of $1\times10^{15}$ ($cm^{-2}$), thereby forming source and drain regions 31 of an N-type TFT.

<<Step 3 (See FIG. 21)>>

Next, after having removed away the resist pattern PR used for etching, again implant P ions P+ by ion implant methods into the poly-Si films 30, 31 at an acceleration voltage of 65 KeV with a dose amount of $2\times10^{13}$ ($cm^{-2}$), thus newly forming N-type TFT's LDD regions 32 (N-type impurity containing regions less in impurity concentration than the source/drain regions 31) along the scan lead electrodes 10.

An LDD region length is defined by a side etch amount when the Mo film is subject to wet etching. In the case of this embodiment, it is about 0.8 μm. This length is controllable by changing an overetching time of Mo. A variation of the LDD length within the substrate was found to measure about 0.1 μm—this is a good result. Using such process makes it possible to omit a mask pattern fabrication step(s) for forming the LDDs, thus enabling simplification of the process.

<<Step 4 (See FIG. 22)>>

Next, activate the impurity as implanted into the poly-Si films at the steps 2 and 3 by rapid thermal anneal (RTA) methods for irradiation of light of an excimer lamp(s) or a metal halide(s). Performing annealing by use of light containing increased ultraviolet light rays of the excimer lamp(s) or metal halide lamp(s) makes it possible to selectively heat up only the poly-Si layers 31, 32 while avoiding damages otherwise occurring due to heat-up of glass substrate(s). The impurity activation may alternatively be achieved by thermal processing at certain temperatures higher than or equal to 450° C. as far as substrate shrinkage and curvature deformation cause no specific problems.

<<Step 5 (See FIG. 23)>>

Next, form a $SiO_2$ film with a thickness of 500 nm by plasma CVD methods using a mixture gas of tetraethoxysilane and oxygen, thus obtaining an interlayer dielectric film 21. At this time a mixture ratio of tetraethoxysilane and $O_2$ at this time is set at 1:5 with a fabrication temperature of 350° C.

Next, after having formed a specified resist pattern, define contact through-holes TH1, TH2 in the interlayer dielectric film by wet etch methods using mixed acid. Subsequently, sputter methods are used to sequentially form and laminate a layer of Mo of 50 nm thick, a 500-nm thick Al—Si—Cu alloy layer and a 50-nm thick Mo layer; thereafter, form a prespecified resist pattern; then, perform all-at-once etching by reactive ion etch methods using a mixture gas of $BCl_3$ and $Cl_2$, thus obtaining signal lead electrodes 12 and source electrodes 13 plus common electrodes 11.

<<Step 6 (See FIG. 24)>>

Fabricate a 200-nm thick $Si_3N_4$ film 22 by plasma CVD methods using a mixture gas of $SiH_4$ and $NH_3$ plus $N_2$; further, deposit a layer of photosensitive acrylic resin by spin coat techniques to a thickness of about 3.5 μm; then, use a specified mask to perform exposure and development to thereby form a through-hole TH3 in the acrylic resin. Next, perform backing at 230° C. for 20 minutes to bake the acrylic resin, thus obtaining an organic protective film 23 with a thickness of 2.3 μm. Subsequently, with a pattern of the through-hole TH3 as provided in the organic protective film 23 being used as a mask, let its underlying $Si_3N_4$ film 22 undergo chemical machining using $CF_4$ by reactive ion etching methods, thereby forming a through-hole(s) in the $Si_3N_4$ film.

Processing the underlying dielectric film 22 with the organic protective film 23 as a mask makes it possible to pattern the two-layered film by a single photolithography process step, which in turn enabled simplification of the process.

<<Step 7 (See FIG. 25)>>

Lastly, fabricate an ITO film by sputter methods to a thickness of 70 nm; then, etch it by wet etch methods using mixed acids into a prespecified shape to thereby form a pixel electrode(s), thus completing an active matrix substrate.

According to the present invention, it is possible to realize a bright liquid crystal display device which is low in power consumption while offering excellent on-screen display image quality.

What is claimed is:

1. A transflective type liquid crystal display device comprising a pair of transparent substrates and a liquid crystal layer interposed between the pair of transparent substrates, wherein:

one of the pair of transparent substrates has a plurality of parallel scan electrodes extending in a first direction and being provided along a second direction intersecting the first direction, a plurality of parallel signal electrodes extending in the second direction and being provided in the first direction, and a plurality of pixel regions each surrounded by a pair of the plurality of scan electrodes adjacent to each other and a pair of the plurality of signal electrodes adjacent to each other, formed on its principal surface facing the liquid crystal layer respectively, respective one of the plurality of pixel regions is provided with a liquid crystal drive electrode receiving an image signal from one of the plurality of signal electrodes through an active element as controlled by one of the plurality of scan electrodes, and an optical reflective layer being less in area than the liquid crystal drive electrode and reflecting incident light from another of the pair of substrates to the another of the pair of substrates, and a common electrode covered by the optical reflective layer below the optical reflective layer, the optical reflective layer extends in a longitudinal direction of the respective one of the plurality of pixel regions below the liquid crystal drive electrode being spaced from the pair of the plurality of signal electrodes which are extended in the longitudinal direction of the respective one of the plurality of pixel regions and is electrically connected to the liquid crystal drive electrode, and the liquid crystal drive electrode is formed above both areas provided between the optical reflective layer and the pair of the plurality of signal electrodes as well as above the optical reflective layer to let light pass from the one of the pair of substrates to liquid crystal layer through the areas and the liquid crystal drive electrode itself, and the common electrode is electrically isolated from both the liquid crystal drive electrode and the optical reflective layer and is spaced from the optical reflective layer by an insulating layer to form a charge storage capacitance for the liquid crystal drive electrode together with the optical reflective layer.

2. A transflective type liquid crystal display device comprising a first transparent substrate and a second transparent substrate between which a liquid crystal layer is interposed, wherein:

the first transparent substrate has a plurality of scan electrodes extending in a first direction and being arranged along a second direction intersecting the first direction, a plurality of signal electrodes extending in the second direction and being arranged in the first direction, and a plurality of pixel regions, each formed on its principal surface facing the liquid crystal layer, each of the plurality of pixel regions is surrounded by a pair of the plurality of scan electrodes adjacent to each other and a pair of the plurality of signal electrodes adjacent to each other, and is elongated in the second direction to have a length along this direction greater than that along the first direction, respective one of the plurality of pixel regions is provided with an active element receiving an image signal from one of the plurality of signal electrodes and being controlled by one of the plurality of scan electrodes, a liquid crystal drive electrode receiving the image signal from the active and applying a voltage corresponding to the image signal to the liquid crystal layer, an optical reflective layer being disposed under the liquid crystal drive electrode and reflecting incident light thereon from the second substrate to the liquid crystal layer through the liquid crystal drive electrode, and a common electrode below and covered by the optical reflective layer, the optical reflective layer is spaced apart from each of the pair of the plurality of signal electrodes to provide areas permitting light to pass from the first transparent substrate to the liquid crystal layer at both sides thereof extended along the pair of the signal electrodes and is electrically connected to the liquid crystal drive electrode, each of the areas is provided between each side of the optical reflective layer and one of the pair of the signal electrodes and is covered by the liquid crystal layer drive electrode to let the light passing through the areas be transmitted into the liquid crystal through the liquid crystal drive electrode, and the common electrode is electrically isolated from both the liquid crystal drive electrode and the optical reflective layer and is spaced from the optical reflective layer by an insulating layer to form a charge storage capacitance for the liquid crystal drive electrode together with the optical reflective layer.

3. The transflective type liquid crystal display device according to claim 2, wherein the plurality of scan electrodes are disposed below the insulating layer to be same layers as that of the common electrode, and the common electrode is made of a material utilized for the plurality of scan electrodes.

4. The transflective type liquid crystal display device according to claim 2, wherein both of the first transparent substrate and the second transparent substrate are glass substrates and the liquid crystal drive electrode is made of indium tin oxide or indium-zinc oxides.

5. The transflective type liquid crystal display device according to claim 2, further comprising a back-light unit radiating light to the liquid crystal layer through the first transparent substrate, wherein the plurality of signal electrodes are disposed on the insulating layer to be same layers as that of the optical reflective layer, the optical reflective layer is made of a material utilized for the plurality of signal electrodes, and both the plurality of signal electrodes and the optical reflective layer are covered with an insulating film.

6. The transflective type liquid crystal display device according to claim 2, further comprising a back-light unit radiating light to the liquid crystal layer through the first transparent substrate, wherein the light from the back-light unit passes through the areas spacing the optical reflective layer apart from the pair of the plurality of signal electrodes in the each of the plurality of pixel regions.

7. The transflective type liquid crystal display device according to claim 2, wherein the optical reflective layer has an almost rectangular planar shape extending in the second direction.

* * * * *